(12) United States Patent
Ellis et al.

(10) Patent No.: US 8,710,566 B2
(45) Date of Patent: Apr. 29, 2014

(54) TECHNIQUES FOR FORMING A CONTACT TO A BURIED DIFFUSION LAYER IN A SEMICONDUCTOR MEMORY DEVICE

(75) Inventors: Wayne Ellis, Los Gatos, CA (US); John Kim, Santa Clara, CA (US)

(73) Assignee: Micron Technology, Inc., Boise, ID (US)

( * ) Notice: Subject to any disclaimer, the term of this patent is extended or adjusted under 35 U.S.C. 154(b) by 303 days.

(21) Appl. No.: 12/717,776

(22) Filed: Mar. 4, 2010

(65) Prior Publication Data

US 2010/0224924 A1 Sep. 9, 2010

Related U.S. Application Data

(60) Provisional application No. 61/157,504, filed on Mar. 4, 2009.

(51) Int. Cl.
*H01L 27/108* (2006.01)
*H01L 29/94* (2006.01)

(52) U.S. Cl.
USPC ............. 257/300; 257/E27.084; 257/E21.649

(58) Field of Classification Search
USPC .......... 257/300, 773, E27.016, 296, 302, 326, 257/E27.096, E29.183, E29.189, E29.262, 257/E29.274, E21.375, E27.084
See application file for complete search history.

(56) References Cited

U.S. PATENT DOCUMENTS

| | | | |
|---|---|---|---|
| 3,439,214 A | 4/1969 | Kabell | |
| 3,997,799 A | 12/1976 | Baker | |
| 4,032,947 A | 6/1977 | Kesel et al. | |
| 4,250,569 A | 2/1981 | Sasaki et al. | |
| 4,262,340 A | 4/1981 | Sasaki et al. | |

(Continued)

FOREIGN PATENT DOCUMENTS

| | | |
|---|---|---|
| CA | 272437 | 7/1927 |
| EP | 0 030 856 | 6/1981 |

(Continued)

OTHER PUBLICATIONS

Arimoto et al., A Configurable Enhanced T2RAM Macro for System-Level Power Management Unified Memory, 2006, VLSI Symposium.

(Continued)

*Primary Examiner* — Daniel Luke
*Assistant Examiner* — Khaja Ahmad
(74) *Attorney, Agent, or Firm* — Wilmer Cutler Pickering Hale and Dorr LLP

(57) ABSTRACT

Techniques for forming a contact to a buried diffusion layer in a semiconductor memory device are disclosed. In one particular exemplary embodiment, the techniques may be realized as a semiconductor memory device. The semiconductor memory device may comprise a substrate comprising an upper layer. The semiconductor memory device may also comprise an array of dummy pillars formed on the upper layer of the substrate and arranged in rows and columns. Each of the dummy pillars may extend upward from the upper layer and have a bottom contact that is electrically connected with the upper layer of the substrate. The semiconductor memory device may also comprise an array of active pillars formed on the upper layer of the substrate and arranged in rows and columns. Each of the active pillars may extend upward from the upper layer and have an active first region, an active second region, and an active third region. Each of the active pillars may also be electrically connected with the upper layer of the substrate.

23 Claims, 8 Drawing Sheets

(56) References Cited

U.S. PATENT DOCUMENTS

| | | | |
|---|---|---|---|
| 4,298,962 A | 11/1981 | Hamano et al. |
| 4,371,955 A | 2/1983 | Sasaki |
| 4,527,181 A | 7/1985 | Sasaki |
| 4,630,089 A | 12/1986 | Sasaki et al. |
| 4,658,377 A | 4/1987 | McElroy |
| 4,791,610 A | 12/1988 | Takemae |
| 4,807,195 A | 2/1989 | Busch et al. |
| 4,954,989 A | 9/1990 | Auberton-Herve et al. |
| 4,979,014 A | 12/1990 | Hieda et al. |
| 5,010,524 A | 4/1991 | Fifield et al. |
| 5,144,390 A | 9/1992 | Matloubian |
| 5,164,805 A | 11/1992 | Lee |
| 5,258,635 A | 11/1993 | Nitayama et al. |
| 5,313,432 A | 5/1994 | Lin et al. |
| 5,315,541 A | 5/1994 | Harari et al. |
| 5,350,938 A | 9/1994 | Matsukawa |
| 5,355,330 A | 10/1994 | Hisamoto et al. |
| 5,388,068 A | 2/1995 | Ghoshal et al. |
| 5,397,726 A | 3/1995 | Bergemont et al. |
| 5,432,730 A | 7/1995 | Shubat et al. |
| 5,446,299 A | 8/1995 | Acovic et al. |
| 5,448,513 A | 9/1995 | Hu et al. |
| 5,466,625 A | 11/1995 | Hsieh et al. |
| 5,489,792 A | 2/1996 | Hu et al. |
| 5,506,436 A | 4/1996 | Hayashi et al. |
| 5,515,383 A | 5/1996 | Katoozi |
| 5,526,307 A | 6/1996 | Yiu et al. |
| 5,528,062 A | 6/1996 | Hsieh et al. |
| 5,568,356 A | 10/1996 | Schwartz |
| 5,583,808 A | 12/1996 | Brahmbhatt |
| 5,593,912 A | 1/1997 | Rajeevakumar |
| 5,606,188 A | 2/1997 | Bronner et al. |
| 5,608,250 A | 3/1997 | Kalnitsky |
| 5,627,092 A | 5/1997 | Alsmeier et al. |
| 5,631,186 A | 5/1997 | Park et al. |
| 5,677,867 A | 10/1997 | Hazani |
| 5,696,718 A | 12/1997 | Hartmann |
| 5,740,099 A | 4/1998 | Tanigawa |
| 5,754,469 A | 5/1998 | Hung et al. |
| 5,774,411 A | 6/1998 | Hsieh et al. |
| 5,778,243 A | 7/1998 | Aipperspach et al. |
| 5,780,906 A | 7/1998 | Wu et al. |
| 5,784,311 A | 7/1998 | Assaderaghi et al. |
| 5,798,968 A | 8/1998 | Lee et al. |
| 5,811,283 A | 9/1998 | Sun |
| 5,847,411 A | 12/1998 | Morii |
| 5,877,978 A | 3/1999 | Morishita et al. |
| 5,886,376 A | 3/1999 | Acovic et al. |
| 5,886,385 A | 3/1999 | Arisumi et al. |
| 5,897,351 A | 4/1999 | Forbes |
| 5,929,479 A | 7/1999 | Oyama |
| 5,930,648 A | 7/1999 | Yang |
| 5,936,265 A | 8/1999 | Koga |
| 5,939,745 A | 8/1999 | Park et al. |
| 5,943,258 A | 8/1999 | Houston et al. |
| 5,943,581 A | 8/1999 | Lu et al. |
| 5,960,265 A | 9/1999 | Acovic et al. |
| 5,968,840 A | 10/1999 | Park et al. |
| 5,977,578 A | 11/1999 | Tang |
| 5,982,003 A | 11/1999 | Hu et al. |
| 5,986,914 A | 11/1999 | McClure |
| 6,018,172 A | 1/2000 | Hidada et al. |
| 6,048,756 A | 4/2000 | Lee et al. |
| 6,081,443 A | 6/2000 | Morishita |
| 6,096,598 A | 8/2000 | Furukawa et al. |
| 6,097,056 A | 8/2000 | Hsu et al. |
| 6,097,624 A | 8/2000 | Chung et al. |
| 6,111,778 A | 8/2000 | MacDonald et al. |
| 6,114,725 A * | 9/2000 | Furukawa et al. ............ 257/330 |
| 6,121,077 A | 9/2000 | Hu et al. |
| 6,133,597 A | 10/2000 | Li et al. |
| 6,157,216 A | 12/2000 | Lattimore et al. |
| 6,171,923 B1 | 1/2001 | Chi et al. |
| 6,177,300 B1 | 1/2001 | Houston et al. |
| 6,177,698 B1 | 1/2001 | Gruening et al. |
| 6,177,708 B1 | 1/2001 | Kuang et al. |
| 6,214,694 B1 | 4/2001 | Leobandung et al. |
| 6,222,217 B1 | 4/2001 | Kunikiyo |
| 6,225,158 B1 | 5/2001 | Furukawa et al. |
| 6,245,613 B1 | 6/2001 | Hsu et al. |
| 6,252,281 B1 | 6/2001 | Yamamoto et al. |
| 6,262,935 B1 | 7/2001 | Parris et al. |
| 6,292,424 B1 | 9/2001 | Ohsawa |
| 6,297,090 B1 | 10/2001 | Kim |
| 6,300,649 B1 | 10/2001 | Hu et al. |
| 6,320,227 B1 | 11/2001 | Lee et al. |
| 6,333,532 B1 | 12/2001 | Davari et al. |
| 6,333,866 B1 | 12/2001 | Ogata |
| 6,350,653 B1 | 2/2002 | Adkisson et al. |
| 6,351,426 B1 | 2/2002 | Ohsawa |
| 6,359,802 B1 | 3/2002 | Lu et al. |
| 6,384,445 B1 | 5/2002 | Hidaka et al. |
| 6,391,658 B1 | 5/2002 | Gates et al. |
| 6,403,435 B1 | 6/2002 | Kang et al. |
| 6,421,269 B1 | 7/2002 | Somasekhar et al. |
| 6,424,011 B1 | 7/2002 | Assaderaghi et al. |
| 6,424,016 B1 | 7/2002 | Houston |
| 6,429,477 B1 | 8/2002 | Mandelman et al. |
| 6,432,769 B1 | 8/2002 | Fukuda et al. |
| 6,440,872 B1 | 8/2002 | Mandelman et al. |
| 6,441,435 B1 | 8/2002 | Chan |
| 6,441,436 B1 | 8/2002 | Wu et al. |
| 6,466,511 B2 | 10/2002 | Fujita et al. |
| 6,479,862 B1 | 11/2002 | King et al. |
| 6,480,407 B1 | 11/2002 | Keeth |
| 6,492,211 B1 | 12/2002 | Divakaruni et al. |
| 6,518,105 B1 | 2/2003 | Yang et al. |
| 6,531,754 B1 | 3/2003 | Nagano et al. |
| 6,537,871 B2 | 3/2003 | Forbes |
| 6,538,916 B2 | 3/2003 | Ohsawa |
| 6,544,837 B1 | 4/2003 | Divakaruni et al. |
| 6,548,848 B2 | 4/2003 | Horiguchi et al. |
| 6,549,450 B1 | 4/2003 | Hsu et al. |
| 6,552,398 B2 | 4/2003 | Hsu et al. |
| 6,552,932 B1 | 4/2003 | Cernea |
| 6,556,477 B2 | 4/2003 | Hsu et al. |
| 6,560,142 B1 | 5/2003 | Ando |
| 6,563,733 B2 | 5/2003 | Liu et al. |
| 6,566,177 B1 | 5/2003 | Radens et al. |
| 6,567,330 B2 | 5/2003 | Fujita et al. |
| 6,573,566 B2 | 6/2003 | Ker et al. |
| 6,574,135 B1 | 6/2003 | Komatsuzaki |
| 6,590,258 B2 | 7/2003 | Divakauni et al. |
| 6,590,259 B2 | 7/2003 | Adkisson et al. |
| 6,617,651 B2 | 9/2003 | Ohsawa |
| 6,621,725 B2 | 9/2003 | Ohsawa |
| 6,632,723 B2 | 10/2003 | Watanabe et al. |
| 6,650,565 B1 | 11/2003 | Ohsawa |
| 6,653,175 B1 | 11/2003 | Nemati et al. |
| 6,686,624 B2 | 2/2004 | Hsu |
| 6,703,673 B2 | 3/2004 | Houston |
| 6,707,118 B2 | 3/2004 | Muljono et al. |
| 6,714,436 B1 | 3/2004 | Burnett et al. |
| 6,721,222 B2 | 4/2004 | Somasekhar et al. |
| 6,825,524 B1 | 11/2004 | Ikehashi et al. |
| 6,861,689 B2 | 3/2005 | Burnett |
| 6,870,225 B2 | 3/2005 | Bryant et al. |
| 6,882,566 B2 | 4/2005 | Nejad et al. |
| 6,888,770 B2 | 5/2005 | Ikehashi |
| 6,894,913 B2 | 5/2005 | Yamauchi |
| 6,897,098 B2 | 5/2005 | Hareland et al. |
| 6,903,984 B1 | 6/2005 | Tang et al. |
| 6,909,151 B2 | 6/2005 | Hareland et al. |
| 6,912,150 B2 | 6/2005 | Portmann et al. |
| 6,913,964 B2 | 7/2005 | Hsu |
| 6,936,508 B2 | 8/2005 | Visokay et al. |
| 6,969,662 B2 | 11/2005 | Fazan et al. |
| 6,975,536 B2 | 12/2005 | Maayan et al. |
| 6,982,902 B2 | 1/2006 | Gogl et al. |
| 6,987,041 B2 | 1/2006 | Ohkawa |
| 7,030,436 B2 | 4/2006 | Forbes |
| 7,037,790 B2 | 5/2006 | Chang et al. |
| 7,041,538 B2 | 5/2006 | Ieong et al. |
| 7,042,765 B2 | 5/2006 | Sibigtroth et al. |

(56) References Cited

U.S. PATENT DOCUMENTS

| | | |
|---|---|---|
| 7,061,806 B2 | 6/2006 | Tang et al. |
| 7,085,153 B2 | 8/2006 | Ferrant et al. |
| 7,085,156 B2 | 8/2006 | Ferrant et al. |
| 7,170,807 B2 | 1/2007 | Fazan et al. |
| 7,177,175 B2 | 2/2007 | Fazan et al. |
| 7,187,581 B2 | 3/2007 | Ferrant et al. |
| 7,230,846 B2 | 6/2007 | Keshavarzi |
| 7,233,024 B2 | 6/2007 | Scheuerlein et al. |
| 7,256,459 B2 | 8/2007 | Shino |
| 7,301,803 B2 | 11/2007 | Okhonin et al. |
| 7,301,838 B2 | 11/2007 | Waller |
| 7,317,641 B2 | 1/2008 | Scheuerlein |
| 7,324,387 B1 | 1/2008 | Bergemont et al. |
| 7,335,934 B2 | 2/2008 | Fazan |
| 7,341,904 B2 | 3/2008 | Willer |
| 7,416,943 B2 | 8/2008 | Figura et al. |
| 7,456,439 B1 | 11/2008 | Horch |
| 7,477,540 B2 | 1/2009 | Okhonin et al. |
| 7,492,632 B2 | 2/2009 | Carman |
| 7,517,744 B2 | 4/2009 | Mathew et al. |
| 7,539,041 B2 | 5/2009 | Kim et al. |
| 7,542,340 B2 | 6/2009 | Fisch et al. |
| 7,542,345 B2 | 6/2009 | Okhonin et al. |
| 7,545,694 B2 | 6/2009 | Srinivasa Raghavan et al. |
| 7,606,066 B2 | 10/2009 | Okhonin et al. |
| 7,696,032 B2 | 4/2010 | Kim et al. |
| 2001/0055859 A1 | 12/2001 | Yamada et al. |
| 2002/0030214 A1 | 3/2002 | Horiguchi |
| 2002/0034855 A1 | 3/2002 | Horiguchi et al. |
| 2002/0036322 A1 | 3/2002 | Divakauni et al. |
| 2002/0051378 A1 | 5/2002 | Ohsawa |
| 2002/0064913 A1 | 5/2002 | Adkisson et al. |
| 2002/0070411 A1 | 6/2002 | Vermandel et al. |
| 2002/0072155 A1 | 6/2002 | Liu et al. |
| 2002/0076880 A1 | 6/2002 | Yamada et al. |
| 2002/0086463 A1 | 7/2002 | Houston et al. |
| 2002/0089038 A1 | 7/2002 | Ning |
| 2002/0098643 A1 | 7/2002 | Kawanaka et al. |
| 2002/0110018 A1 | 8/2002 | Ohsawa |
| 2002/0114191 A1 | 8/2002 | Iwata et al. |
| 2002/0130341 A1 | 9/2002 | Horiguchi et al. |
| 2002/0160581 A1 | 10/2002 | Watanabe et al. |
| 2002/0180069 A1 | 12/2002 | Houston |
| 2003/0003608 A1 | 1/2003 | Arikado et al. |
| 2003/0015757 A1 | 1/2003 | Ohsawa |
| 2003/0035324 A1 | 2/2003 | Fujita et al. |
| 2003/0042516 A1 | 3/2003 | Forbes et al. |
| 2003/0047784 A1 | 3/2003 | Matsumoto et al. |
| 2003/0057487 A1 | 3/2003 | Yamada et al. |
| 2003/0057490 A1 | 3/2003 | Nagano et al. |
| 2003/0102497 A1 | 6/2003 | Fried et al. |
| 2003/0112659 A1 | 6/2003 | Ohsawa |
| 2003/0123279 A1 | 7/2003 | Aipperspach et al. |
| 2003/0146474 A1 | 8/2003 | Ker et al. |
| 2003/0146488 A1 | 8/2003 | Nagano et al. |
| 2003/0151112 A1 | 8/2003 | Yamada et al. |
| 2003/0231521 A1 | 12/2003 | Ohsawa |
| 2004/0021137 A1 | 2/2004 | Fazan et al. |
| 2004/0021179 A1 | 2/2004 | Lee |
| 2004/0029335 A1 | 2/2004 | Lee et al. |
| 2004/0075143 A1 | 4/2004 | Bae et al. |
| 2004/0108532 A1 | 6/2004 | Forbes et al. |
| 2004/0188714 A1 | 9/2004 | Scheuerlein et al. |
| 2004/0217420 A1 | 11/2004 | Yeo et al. |
| 2005/0001257 A1 | 1/2005 | Schloesser et al. |
| 2005/0001269 A1 | 1/2005 | Hayashi et al. |
| 2005/0017240 A1 | 1/2005 | Fazan |
| 2005/0047240 A1 | 3/2005 | Ikehashi et al. |
| 2005/0062088 A1 | 3/2005 | Houston |
| 2005/0063224 A1 | 3/2005 | Fazan et al. |
| 2005/0064659 A1 | 3/2005 | Willer |
| 2005/0105342 A1 | 5/2005 | Tang et al. |
| 2005/0111255 A1 | 5/2005 | Tang et al. |
| 2005/0121710 A1 | 6/2005 | Shino |
| 2005/0135169 A1 | 6/2005 | Somasekhar et al. |
| 2005/0141262 A1 | 6/2005 | Yamada et al. |
| 2005/0141290 A1 | 6/2005 | Tang et al. |
| 2005/0145886 A1 | 7/2005 | Keshavarzi et al. |
| 2005/0145935 A1 | 7/2005 | Keshavarzi et al. |
| 2005/0167751 A1 | 8/2005 | Nakajima et al. |
| 2005/0189576 A1 | 9/2005 | Ohsawa |
| 2005/0208716 A1 | 9/2005 | Takaura et al. |
| 2005/0213365 A1* | 9/2005 | Salling .......................... 365/145 |
| 2005/0226070 A1 | 10/2005 | Ohsawa |
| 2005/0232043 A1 | 10/2005 | Ohsawa |
| 2005/0242396 A1 | 11/2005 | Park et al. |
| 2005/0265107 A1 | 12/2005 | Tanaka |
| 2006/0043484 A1 | 3/2006 | Cabral et al. |
| 2006/0091462 A1 | 5/2006 | Okhonin et al. |
| 2006/0098481 A1 | 5/2006 | Okhonin et al. |
| 2006/0126374 A1 | 6/2006 | Waller et al. |
| 2006/0131650 A1 | 6/2006 | Okhonin et al. |
| 2006/0223302 A1 | 10/2006 | Chang et al. |
| 2007/0008811 A1 | 1/2007 | Keeth et al. |
| 2007/0023833 A1 | 2/2007 | Okhonin et al. |
| 2007/0045709 A1 | 3/2007 | Yang |
| 2007/0058427 A1 | 3/2007 | Okhonin et al. |
| 2007/0064489 A1 | 3/2007 | Bauser |
| 2007/0085140 A1 | 4/2007 | Bassin |
| 2007/0097751 A1 | 5/2007 | Popoff et al. |
| 2007/0114599 A1 | 5/2007 | Hshieh |
| 2007/0133330 A1 | 6/2007 | Ohsawa |
| 2007/0138524 A1 | 6/2007 | Kim et al. |
| 2007/0138530 A1 | 6/2007 | Okhonin et al. |
| 2007/0187751 A1 | 8/2007 | Hu et al. |
| 2007/0187775 A1 | 8/2007 | Okhonin et al. |
| 2007/0200176 A1 | 8/2007 | Kammler et al. |
| 2007/0252205 A1 | 11/2007 | Hoentschel et al. |
| 2007/0263466 A1 | 11/2007 | Morishita et al. |
| 2007/0278578 A1 | 12/2007 | Yoshida et al. |
| 2008/0049486 A1 | 2/2008 | Gruening-von Schwerin |
| 2008/0083949 A1 | 4/2008 | Zhu et al. |
| 2008/0099808 A1 | 5/2008 | Burnett et al. |
| 2008/0130379 A1 | 6/2008 | Ohsawa |
| 2008/0133849 A1 | 6/2008 | Demi et al. |
| 2008/0165577 A1 | 7/2008 | Fazan et al. |
| 2008/0253179 A1 | 10/2008 | Slesazeck |
| 2008/0258206 A1 | 10/2008 | Hofmann |
| 2008/0283816 A1* | 11/2008 | Takaishi ............................ 257/4 |
| 2009/0086535 A1 | 4/2009 | Ferrant et al. |
| 2009/0121269 A1 | 5/2009 | Caillat et al. |
| 2009/0127592 A1 | 5/2009 | El-Kareh et al. |
| 2009/0201723 A1 | 8/2009 | Okhonin et al. |
| 2009/0230454 A1* | 9/2009 | Pekny .......................... 257/319 |
| 2010/0085813 A1 | 4/2010 | Shino |
| 2010/0091586 A1 | 4/2010 | Carman |
| 2010/0110816 A1 | 5/2010 | Nautiyal et al. |

FOREIGN PATENT DOCUMENTS

| | | |
|---|---|---|
| EP | 0 350 057 | 1/1990 |
| EP | 0 354 348 | 2/1990 |
| EP | 0 202 515 | 3/1991 |
| EP | 0 207 619 | 8/1991 |
| EP | 0 175 378 | 11/1991 |
| EP | 0 253 631 | 4/1992 |
| EP | 0 513 923 | 11/1992 |
| EP | 0 300 157 | 5/1993 |
| EP | 0 564 204 | 10/1993 |
| EP | 0 579 566 | 1/1994 |
| EP | 0 362 961 | 2/1994 |
| EP | 0 599 506 | 6/1994 |
| EP | 0 359 551 | 12/1994 |
| EP | 0 366 882 | 5/1995 |
| EP | 0 465 961 | 8/1995 |
| EP | 0 694 977 | 1/1996 |
| EP | 0 333 426 | 7/1996 |
| EP | 0 727 820 | 8/1996 |
| EP | 0 739 097 | 10/1996 |
| EP | 0 245 515 | 4/1997 |
| EP | 0 788 165 | 8/1997 |
| EP | 0 801 427 | 10/1997 |
| EP | 0 510 607 | 2/1998 |
| EP | 0 537 677 | 8/1998 |

(56) References Cited

FOREIGN PATENT DOCUMENTS

| | | |
|---|---|---|
| EP | 0 858 109 | 8/1998 |
| EP | 0 860 878 | 8/1998 |
| EP | 0 869 511 | 10/1998 |
| EP | 0 878 804 | 11/1998 |
| EP | 0 920 059 | 6/1999 |
| EP | 0 924 766 | 6/1999 |
| EP | 0 642 173 | 7/1999 |
| EP | 0 727 822 | 8/1999 |
| EP | 0 933 820 | 8/1999 |
| EP | 0 951 072 | 10/1999 |
| EP | 0 971 360 | 1/2000 |
| EP | 0 980 101 | 2/2000 |
| EP | 0 601 590 | 4/2000 |
| EP | 0 993 037 | 4/2000 |
| EP | 0 836 194 | 5/2000 |
| EP | 0 599 388 | 8/2000 |
| EP | 0 689 252 | 8/2000 |
| EP | 0 606 758 | 9/2000 |
| EP | 0 682 370 | 9/2000 |
| EP | 1 073 121 | 1/2001 |
| EP | 0 726 601 | 9/2001 |
| EP | 0 731 972 | 11/2001 |
| EP | 1 162 663 | 12/2001 |
| EP | 1 162 744 | 12/2001 |
| EP | 1 179 850 | 2/2002 |
| EP | 1 180 799 | 2/2002 |
| EP | 1 191 596 | 3/2002 |
| EP | 1 204 146 | 5/2002 |
| EP | 1 204 147 | 5/2002 |
| EP | 1 209 747 | 5/2002 |
| EP | 0 744 772 | 8/2002 |
| EP | 1 233 454 | 8/2002 |
| EP | 0 725 402 | 9/2002 |
| EP | 1 237 193 | 9/2002 |
| EP | 1 241 708 | 9/2002 |
| EP | 1 253 634 | 10/2002 |
| EP | 0 844 671 | 11/2002 |
| EP | 1 280 205 | 1/2003 |
| EP | 1 288 955 | 3/2003 |
| FR | 2 197 494 | 3/1974 |
| GB | 1 414 228 | 11/1975 |
| JP | H04-176163 A | 6/1922 |
| JP | S62-007149 A | 1/1987 |
| JP | S62-272561 | 11/1987 |
| JP | 02-294076 | 12/1990 |
| JP | 03-171768 | 7/1991 |
| JP | 05-347419 | 12/1993 |
| JP | 08-213624 | 8/1996 |
| JP | H08-213624 A | 8/1996 |
| JP | 08-274277 | 10/1996 |
| JP | H08-316337 A | 11/1996 |
| JP | 09-046688 | 2/1997 |
| JP | 09-082912 | 3/1997 |
| JP | 10-242470 | 9/1998 |
| JP | 11-087649 | 3/1999 |
| JP | 2000-247735 A | 8/2000 |
| JP | 12-274221 A | 9/2000 |
| JP | 12-389106 A | 12/2000 |
| JP | 13-180633 A | 6/2001 |
| JP | 2002-009081 | 1/2002 |
| JP | 2002-083945 | 3/2002 |
| JP | 2002-094027 | 3/2002 |
| JP | 2002-176154 | 6/2002 |
| JP | 2002-246571 | 8/2002 |
| JP | 2002-329795 | 11/2002 |
| JP | 2002-343886 | 11/2002 |
| JP | 2002-353080 | 12/2002 |
| JP | 2003-031693 | 1/2003 |
| JP | 2003-68877 A | 3/2003 |
| JP | 2003-086712 | 3/2003 |
| JP | 2003-100641 | 4/2003 |
| JP | 2003-100900 | 4/2003 |
| JP | 2003-132682 | 5/2003 |
| JP | 2003-203967 | 7/2003 |
| JP | 2003-243528 | 8/2003 |
| JP | 2004-335553 | 11/2004 |
| WO | 01/24268 | 4/2001 |
| WO | 2005/008778 | 1/2005 |

OTHER PUBLICATIONS

Arimoto, A High-Density Scalable Twin Transistor RAM (TTRAM) With Verify Control for SOI Platform Memory IPs, Nov. 2007, Solid-State Circuits.

Asian Technology Information Program (ATIP) Scoops™, "Novel Capacitorless 1T-DRAM From Single-Gate PD-SOI to Double-Gate FinDRAM", May 9, 2005, 9 pages.

Assaderaghi et al., "A Dynamic Threshold Voltage MOSFET (DTMOS) for Ultra-Low Voltage Operation", IEEE IEDM, 1994, pp. 809-812.

Assaderaghi et al., "A Dynamic Threshold Voltage MOSFET (DTMOS) for Very Low Voltage Operation", IEEE Electron Device Letters, vol. 15, No. 12, Dec. 1994, pp. 510-512.

Assaderaghi et al., "A Novel Silicon-On-Insulator (SOI) MOSFET for Ultra Low Voltage Operation", 1994 IEEE Symposium on Low Power Electronics, pp. 58-59.

Assaderaghi et al., "Dynamic Threshold-Voltage MOSFET (DTMOS) for Ultra-Low Voltage VLSI", IEEE Transactions on Electron Devices, vol. 44, No. 3, Mar. 1997, pp. 414-422.

Assaderaghi et al., "High-Field Transport of Inversion-Layer Electrons and Holes Including Velocity Overshoot", IEEE Transactions on Electron Devices, vol. 44, No. 4, Apr. 1997, pp. 664-671.

Avci, Floating Body Cell (FBC) Memory for 16-nm Technology with Low Variation on Thin Silicon and 10-nm BOX, Oct. 2008, SOI Conference.

Bae, Evaluation of 1T RAM using Various Operation Methods with SOONO (Silicon-On-ONO) device, Dec. 2008, IEDM.

Ban, A Scaled Floating Body Cell (FBC) Memory with High-k+Metal Gate on Thin-Silicon and Thin-BOX for 16-nm Technology Node and Beyond, Jun. 2008, VLSI Symposium.

Ban, Ibrahim, et al., "Floating Body Cell with Independently-Controlled Double Gates for High Density Memory," Electron Devices Meeting, 2006. IEDM '06. International, IEEE, Dec. 11-13, 2006.

Bawedin, Maryline, et al., A Capacitorless 1T Dram on SOI Based on Dynamic Coupling and Double-Gate Operation, IEEE Electron Device Letters, vol. 29, No. 7, Jul. 2008.

Blagojevic et al., Capacitorless 1T DRAM Sensing Scheme Automatice Reference Generation, 2006, IEEE J.Solid State Circuits.

Blalock, T., "A High-Speed Clamped Bit-Line Current-Mode Sense Amplifier", IEEE Journal of Solid-State Circuits, vol. 26, No. 4, Apr. 1991, pp. 542-548.

Butt, Scaling Limits of Double Gate and Surround Gate Z-RAM Cells, 2007, IEEE Trans. On El. Dev.

Chan et al., "Effects of Floating Body on Double Polysilicon Partially Depleted SOI Nonvolatile Memory Cell", IEEE Electron Device Letters, vol. 24, No. 2, Feb. 2003, pp. 75-77.

Chan, et al., "SOI MOSFET Design for All-Dimensional Scaling with Short Channel, Narrow Width and Ultra-thin Films", IEEE IEDM, 1995, pp. 631-634.

Chi et al., "Programming and Erase with Floating-Body for High Density Low Voltage Flash EEPROM Fabricated on SOI Wafers", Proceedings 1995 IEEE International SOI Conference, Oct. 1995, pp. 129-130.

Cho et al., "Novel DRAM Cell with Amplified Capacitor for Embedded Application", IEEE, Jun. 2009.

Cho, A novel capacitor-less DRAM cell using Thin Capacitively-Coupled Thyristor (TCCT), 2005, IEDM.

Choi et al., Current Flow Mechanism in Schottky-Barrier MOSFET and Application to the 1T-DRAM, 2008, SSDM.

Choi, High Speed Flash Memory and 1T-DRAM on Dopant Segregated Schottky Barrier (DSSB) FinFET SONOS Device for Multifunctional SoC Applications, Dec. 2008, IEDM.

Clarke, Junctionless Transistors Could Simply Chip Making, Say Researchers, EE Times, Feb. 2010, www.eetimes.com/showArticle.jhtml?articleID=223100050.

(56) References Cited

OTHER PUBLICATIONS

Colinge, J.P., "An SOI voltage-controlled bipolar-MOS device", IEEE Transactions on Electron Devices, vol. ED-34, No. 4, Apr. 1987, pp. 845-849.

Colinge, Nanowire Transistors Without Junctions, Nature NanoTechnology, vol. 5, 2010, pp. 225-229.

Collaert et al., Optimizing the Readout Bias for the Capacitorless 1T Bulk FinFET RAM Cell, 2009, IEEE EDL.

Collaert, Comparison of scaled floating body RAM architectures, Oct. 2008, SOI Conference.

Ershov, Optimization of Substrate Doping for Back-Gate Control in SOI T-RAM Memory Technology, 2005, SOI Conference.

Ertosun et al., A Highly Scalable Capacitorless Double Gate Quantum Well Single Transistor DRAM: 1T-QW DRAM, 2008, IEEE EDL.

Fazan et al., "A Simple 1-Transistor Capacitor-Less Memory Cell for High Performance Embedded DRAMs", IEEE 2002 Custom Integrated Circuits Conference, Jun. 2002, pp. 99-102.

Fazan, A Highly Manufacturable Capacitor-less 1T-DRAM Concept, 2002, SPIE.

Fazan, et al., "Capacitor-Less 1-Transistor DRAM", 2002 IEEE International SOI Conference, Oct. 2002, pp. 10-13.

Fazan, P., "MOSFET Design Simplifies DRAM", EE Times, May 14, 2002 (3 pages).

Fisch, Beffa, Bassin, Soft Error Performance of Z-RAM Floating Body Memory, 2006, SOI Conference.

Fisch, Carman, Customizing SOI Floating Body Memory Architecture for System Performance and Lower Cost, 2006, SAME.

Fisch, Z-RAM® Ultra-Dense Memory for 90nm and Below, 2006, Hot Chips.

Fossum et al., New Insights on Capacitorless Floating Body DRAM Cells, 2007, IEEE EDL.

Fujita, Array Architectureof Floating Body Cell (FBC) with Quasi-Shielded Open Bit Line Scheme for sub-40nm Node, 2008, SOI Conference.

Furuhashi, Scaling Scenario of Floating Body Cell (FBC) Suppressing Vth Variation Due to Random Dopant Fluctuation, Dec. 2008, SOI Conference.

Furuyama et al., "An Experimental 2-bit/Cell Storage DRAM for Macrocell or Memory-on-Logic Application", IEEE Journal of Solid-State Circuits, vol. 24, No. 2, Apr. 1989, pp. 388-393.

Giffard et al., "Dynamic Effects in SOI MOSFET's", IEEE, 1991, pp. 160-161.

Gupta et al., SPICE Modeling of Self Sustained Operation (SSO) to Program Sub-90nm Floating Body Cells, Oct. 2009, Conf on Simulation of Semiconductor Processes & Devices.

Han et al., Bulk FinFET Unified-RAM (URAM) Cell for Multifunctioning NVM and Capacitorless 1T-DRAM, 2008, IEEE EDL.

Han et al., Partially Depleted SONOS FinFET for Unified RAM (URAM) Unified Function for High-Speed 1T DRAM and Nonvolatile Memory, 2008, IEEE EDL.

Han, Energy Band Engineered Unified-RAM (URAM) for Multi-Functioning 1T-DRAM and NVM, Dec. 2008, IEDM.

Han, Parasitic BJT Read Method for High-Performance Capacitorless 1T-DRAM Mode in Unified RAM, Oct. 2009, IEEE EDL.

Hara, Y., "Toshiba's DRAM Cell Piggybacks on SOI Wafer", EE Times, Jun. 2003.

Hu, C., "SOI (Silicon-on-Insulator) for High Speed Ultra Large Scale Integration", Jpn. J. Appl. Phys. vol. 33 (1994) pp. 365-369, Part 1, No. 1B, Jan. 1994.

Idei et al., "Soft-Error Characteristics in Bipolar Memory Cells with Small Critical Charge", IEEE Transactions on Electron Devices, vol. 38, No. 11, Nov. 1991, pp. 2465-2471.

Ikeda et al., "3-Dimensional Simulation of Turn-off Current in Partially Depleted SOI MOSFETs", IEIC Technical Report, Institute of Electronics, Information and Communication Engineers, 1998, vol. 97, No. 557 (SDM97 186-198), pp. 27-34.

Inoh et al., "FBC (Floating Body Cell) for Embedded DRAM on SOI", 2003 Symposium on VLSI Circuits Digest of Technical Papers, Jun. 2003 (2 pages).

Iyer et al., "SOI MOSFET on Low Cost SPIMOX Substrate", IEEE IEDM, Sep. 1998, pp. 1001-1004.

Jang et al., Highly scalable Z-RAM with remarkably long data retention for DRAM application, Jun. 2009, VLSI.

Jeong et al., "A Capacitor-less 1T DRAM Cell Based on a Surrounding Gate MOSFET with Vertical Channel", Technology Development Team, Technology Development Team, Samsung Electronics Co., Ltd., May 2007.

Jeong et al., "A New Capacitorless 1T DRAm Cell: Surrounding Gate MOSFET with Vertical Channel (SGVC Cell)", IEEE Transactions on Nanotechnology, vol. 6, No. 3, May 2007.

Jeong et al., "Capacitorless DRAM Cell with Highly Scalable Surrounding Gate Structure", Extended Abstracts of the 2006 International Conference on Solid State Devices and Materials, pp. 574-575, Yokohama (2006).

Jeong et al., "Capacitorless Dynamic Random Access Memory Cell with Highly Scalable Surrounding Gate Structure", Japanese Journal of Applied Physics, vol. 46, No. 4B, pp. 2143-2147 (2007).

Kedzierski, J.; "Design Analysis of Thin-Body Silicide Source/Drain Devices", 2001 IEEE International SOI Conference, Oct. 2001, pp. 21-22.

Kim et al., "Chip Level Reliability on SOI Embedded Memory", Proceedings 1998 IEEE International SOI Conference, Oct. 1998, pp. 135-139.

Kuo et al., "A Capacitorless Double-Gate DRAM Cell Design for High Density Applications", IEEE IEDM, Feb. 2002, pp. 843-846.

Kuo et al., "A Capacitorless Double-Gate DRAM Cell", IEEE Electron Device Letters, vol. 23, No. 6, Jun. 2002, pp. 345-347.

Kuo et al., A Capacitorless Double Gate DRAM Technology for Sub 100 nm Embedded and Stand Alone Memory Applications, 2003, IEEE Trans. On El. Dev.

Kwon et al., "A Highly Scalable 4F2 DRAm Cell Utilizing a Doubly Gated Vertical Channel", Extended Abstracts of the 2009 International Conference on Solid State Devices and Materials, UC Berkley, pp. 142-143 Sendai (2009).

Lee et al., "A Novel Pattern Transfer Process for Bonded SOI Gigabit DRAMs", Proceedings 1996 IEEE International SOI Conference, Oct. 1996, pp. 114-115.

Leiss et al., dRAM Design Using the Taper-Isolated Dynamic RAM Cell, IEEE Transactions on Electron Devices, vol. ED-29, No. 4, Apr. 1982, pp. 707-714.

Lin et al., "Opposite Side Floating Gate SOI FLASH Memory Cell", IEEE, Mar. 2000, pp. 12-15.

Liu et al., Surface Generation-Recombination Processes of Gate and STI Oxide Interfaces Responsible for Junction Leakage on SOI, Sep. 2009, ECS Transactions, vol. 25.

Liu, Surface Recombination-Generation Processes of Gate, STI and Buried Oxide Interfaces Responsible for Junction Leakage on SOI, May 2009, ICSI.

Lončar et al., "One of Application of SOI Memory Cell—Memory Array", IEEE Proc. 22nd International Conference on Microelectronics (MIEL 2000), vol. 2, NIŠ, Serbia, May 14-17, 2000, pp. 455-458.

Lu et al., A Novel Two-Transistor Floating Body/Gate Cell for Low Power Nanoscale Embedded DRAM, 2008, IEEE Trans. On El. Dev.

Ma, et al., "Hot-Carrier Effects in Thin-Film Fully Depleted SOI MOSFET's", IEEE Electron Device Letters, vol. 15, No. 6, Jun. 1994, pp. 218-220.

Malhi et al., "Characteristics and Three-Dimensional Integration of MOSFET's in Small-Grain LPCVD Polycrystalline Silicon", IEEE Transactions on Electron Devices, vol. ED-32, No. 2, Feb. 1985, pp. 258-281.

Malinge, An 8Mbit DRAM Design Using a 1TBulk Cell, 2005, VLSI Circuits.

Mandelman et al, "Floating-Body Concerns for SOI Dynamic Random Access Memory (DRAM)", Proceedings 1996 IEEE International SOI Conference, Oct. 1996, pp. 136-137.

Matsuoka et al., FBC Potential of 6F2 Single Cell Operation in Multi Gbit Memories Confirmed by a Newly Developed Method for Measuring Signal Sense Margin, 2007, IEDM.

(56) References Cited

OTHER PUBLICATIONS

Minami, A Floating Body Cell (FBC) fully Compatible with 90nm CMOS Technology(CMOS IV) for 128Mb SOI DRAM, 2005, IEDM.
Mohapatra et al., Effect of Source/Drain Asymmetry on the Performance of Z-RAM0 Devices, Oct. 2009, SOI conference.
Morishita, A Capacitorless Twin-Transistor Random Access Memory (TTRAM) on SOI 2005, CICC.
Morishita, F. et al., "A Configurable Enhanced TTRAM Macro for System-Level Power Management Unified Memory", IEEE Journal of Solid-State Circuits, vol. 42, No. 4, pp. 853, Apr. 2007.
Morishita, F., et al., "A 312-MHz 16-Mb Random-Cycle Embedded DRAM Macro With a Power-Down Data Retention Mode for Mobile Applications", J. Solid-State Circuits, vol. 40, No. 1, pp. 204-212, 2005.
Morishita, F., et al., "Dynamic floating body control SOI CMOS for power managed multimedia ULSIs", Proc. CICC, pp. 263-266, 1997.
Morishita, F., et al., "Leakage Mechanism due to Floating Body and Countermeasure on Dynamic Retention Mode of SOI-DRAM", Symposium on VLSI Technology Digest of Technical Papers, pp. 141-142, 1995.
Nagoga, Studying of Hot Carrier Effect in Floating Body Soi Mosfets by the Transient Charge Pumping Technique, Switzerland 2003.
Nayfeh, A Leakage Current Model for SOI based Floating Body Memory that Includes the Poole-Frenkel Effect, 2008, SOI Conference.
Nemati, A Novel High Density, Low Voltage SRAM Cell with a Vertical NDR Device, 1998, VLSI Tech. Symp.
Nemati, A Novel Thyristor-based SRAM Cell (T-RAM) for High-Speed, Low-Voltage, Giga-scale Memories, 1999, IEDM Conference.
Nemati, Embedded Volatile Memories-Embedded Tutorial: The New Memory Revolution, New Drives Circuits and Systems, ICCAD 2008, Nov. 2008.
Nemati, Fully Planar 0.562μm2 T-RAM Cell in a 130nm SOI CMOS Logic Technology for High-Density High-Performance SRAMs, 2004, IEDM.
Nemati, The New Memory Revolution. New Devices, Circuits and Systems, 2008, ICCAD.
Nemati, Thyristor RAM (T-RAM): A High-Speed High-Density Embedded Memory Technology for Nano-scale CMOS, 2007, Hot Chips.
Nemati, Thyristor-RAM: A Novel Embedded Memory Technology that Outperforms Embedded S RAM/DRAM, 2008, Linley Tech Tour.
Nishiguchi et al., Long Retention of Gain-Cell Dynamic Random Access Memory with Undoped Memory Node, 2007, IEEE EDL.
Oh, Floating Body DRAM Characteristics of Silicon-On-ONO (SOONO) Devices for System-on-Chip (SoC) Applications, 2007, VLSI Symposium.
Ohno et al., "Suppression of Parasitic Bipolar Action in Ultra-Thin-Film Fully-Depleted CMOS/SIMOX Devices by Ar-Ion Implantation into Source/Drain Regions", IEEE Transactions on Electron Devices, vol. 45, No. 5, May 1998, pp. 1071-1076.
Ohsawa et al., "A Memory Using One-Transistor Gain Cell on SOI (FBC) with Performance Suitable for Embedded DRAM's", 2003 Symposium on VLSI Circuits Digest of Technical Papers, Jun. 2003 (4 pages).
Ohsawa et al., "Memory Design Using a One-Transistor Gain Cell on SOI", IEEE Journal of Solid-State Circuits, vol. 37, No. 11, Nov. 2002, pp. 1510-1522.
Ohsawa, A 128Mb Floating Body RAM (FBRAM) on SOI with a Multi-Averaging Scheme of Dummy Cell, 2006 Symposium of VLSI Circuits Digest of Tech Papers, (2006).
Ohsawa, An 18.5ns 128Mb SOI DRAM with a Floating Body Cell, 2005, ISSCC.
Ohsawa, Autonomous Refresh of Floating Body Cell (FBC), Dec. 2008, IEDM.
Ohsawa, Design of a 128-Mb SOI DRAM Using the Floating Body Cell (FBC), Jan. 2006, Solid-State Circuits.
Okhonin, A Capacitor-Less 1T-DRAM Cell, Feb. 2002, Electron Device Letters.
Okhonin, A SOI Capacitor-less 1T-DRAM Concept, 2001, SOI Conference.
Okhonin, Charge Pumping Effects in Partially Depleted SOI MOSFETs, 2003, SOI Conference.
Okhonin, New characterization techniques for SOI and related devices, 2003, ECCTD.
Okhonin, New Generation of Z-RAM, 2007, IEDM.
Okhonin, Principles of Transient Charge Pumping on Partially Depleted SOI MOSFETs, May 2002, Electron Device Letters.
Okhonin, Transient Charge Pumping for Partially and Fully Depleted SOI MOSFETs, 2002, SOI Conference.
Okhonin, Transient effects in PD SOI MOSFETs and potential DRAM applications, 2002, Solid-State Electronics.
Okhonin, Ultra-scaled Z-RAM cell, 2008, SOI Conference.
Okhonin, Z-RAM® (Limits of DRAM), 2009, ESSDERC.
Padilla, Alvaro, et al., "Feedback FET: A Novel Transistor Exhibiting Steep Switching Behavior at Low Bias Voltages," Electron Devices Meeting, 2008. IEDM 2008. IEEE International, Dec. 5-17, 2008.
Park, Fully Depleted Double-Gate 1T-DRAM Cell with NVM Function for High Performance and High Density Embedded DRAM, 2009, IMW.
Pelella et al., "Low-Voltage Transient Bipolar Effect Induced by Dynamic Floating-Body Charging in PD/SOI MOSFETs", Final Camera Ready Art, SOI Conference, Oct. 1995, 2 pages.
Portmann et al., "A SOI Current Memory for Analog Signal Processing at High Temperature", 1999 IEEE International SOI Conference, Oct. 1999, pp. 18-19.
Puget et al., 1T Bulk eDRAM using GIDL Current for High Speed and Low Power applications, 2008, SSDM.
Puget et al., Quantum effects influence on thin silicon film capacitor-less DRAM performance, 2006, SOI Conference.
Puget, FDSOI Floating Body Cell eDRAM Using Gate-Induced Drain-Leakage (GIDL) Write Current for High Speed and Low Power Applications, 2009, IMW.
Ranica et al., 1T-Bulk DRAM cell with improved performances: the way to scaling, 2005, ICMTD.
Ranica, A capacitor-less DRAM cell on 75nm gate length, 16nm thin Fully Depleted SOI device for high density embedded memories, 2004, IEDM.
Ranica, A One Transistor Cell on Bulk Substrate (1T-Bulk) for Low-Cost and High Density eDRAM, 2004, VLSI Symposium.
Rodder et al., "Silicon-On-Insulator Bipolar Transistors", IEEE Electron Device Letters, vol. EDL-4, No. 6, Jun. 1983, pp. 193-195.
Rodriguez, Noel, et al., A-RAM Novel Capacitor-less Dram Memory, SOI Conference, 2009 IEEE International, Oct. 5-8, 2009 pp. 1-2.
Roy, Thyristor-Based Volatile Memory in Nano-Scale CMOS, 2006, ISSCC.
Sailing et al., Reliability of Thyristor Based Memory Cells, 2009, IRPS.
Sasaki et al., Charge Pumping in SOS-MOS Transistors, 1981, IEEE Trans. On El. Dev.
Sasaki et al., Charge Pumping SOS-MOS Transistor Memory, 1978, IEDM.
Schloesser et al., "A 6F2 Buried Wordline DRAM Cell for 40nm and Beyond", IEEE, Qimonda Dresden GmbH & Co., pp. 809-812 (2008).
Shino et al., Floating Body RAM technology and its scalability to 32 nm node and beyond, 2006, IEDM.
Shino et al., Operation Voltage Dependence of Memory Cell Characteristics in Fully Depleted FBC, 2005, IEEE Trans. On El. Dev.
Shino, Fully-Depleted FBC (Floating Body Cell) with Enlarged Signal Window and Excellent Logic Process Compatibility, 2004, IEDM.
Shino, Highly Scalable FBC (Floating Body Cell) with 25nm BOX Structure for Embedded DRAM Applications, 2004, VLSI Symposium.
Sim et al., "Source-Bias Dependent Charge Accumulation in P+ -Poly Gate SOI Dynamic Random Access Memory Cell Transistors", Jpn. J. Appl. Phys. vol. 37 (1998) pp. 1260-1263, Part 1, No. 3B, Mar. 1998.

(56) References Cited

OTHER PUBLICATIONS

Singh, A 2ns-Read-Latency 4Mb Embedded Floating-Body Memory Macro in 45nm SOI Technology, Feb. 2009, ISSCC.
Sinha et al., "In-Depth Analysis of Opposite Channel Based Charge Injection in SOI MOSFETs and Related Defect Creation and Annihilation", Elsevier Science, Microelectronic Engineering 28, 1995, pp. 383-386.
Song, 55 nm Capacitor-less 1T DRAM Cell Transistor with Non-Overlap Structure, Dec. 2008, IEDM.
Stanojevic et al., "Design of a SOI Memory Cell", IEEE Proc. 21st International Conference on Microelectronics (MIEL '97), vol. 1, NIS, Yugoslavia, Sep. 14-17, 1997, pp. 297-300.
Su et al., "Studying the Impact of Gate Tunneling on Dynamic Behaviors of Partially-Depleted SOI CMOS Using BSIMPD", IEEE Proceedings of the International Symposium on Quality Electronic Design (ISQED '02), Apr. 2002 (5 pages).
Suma et al., "An SOI-DRAM with Wide Operating Voltage Range by CMOS/SIMOX Technology", 1994 IEEE International Solid-State Circuits Conference, pp. 138-139.
Tack et al., "The Multi-Stable Behaviour of SOI-NMOS Transistors at Low Temperatures", Proc. 1988 SOS/SOI Technology Workshop (Sea Palms Resort, St. Simons Island, GA, Oct. 1988), p. 78.
Tack et al., "The Multistable Charge Controlled Memory Effect in SOI Transistors at Low Temperatures", IEEE Workshop on Low Temperature Electronics, Aug. 7-8, 1989, University of Vermont, Burlington, pp. 137-141.
Tack et al., "The Multistable Charge-Controlled Memory Effect in SOI MOS Transistors at Low Temperatures", IEEE Transactions on Electron Devices, vol. 37, No. 5, May 1990, pp. 1373-1382.
Tack, et al., "An Analytical Model for the Misis Structure in SOI MOS Devices", Solid-State Electronics vol. 33, No. 3, 1990, pp. 357-364.
Tanaka et al., "Scalability Study on a Capacitorless 1T-DRAM: From Single-gate PD-SOI to Double-gate FINDRAM", 2004 IEEE, 4 pages.
Tang, Poren, Highly Scalable Capacitorless DRAM Cell on Thin-Body with Band-gap Engineered Source and Drain, Extended Abstracts of the 2009 ICSSDM, Sendai, 2009, pp. 144-145.
Terauchi et al., "Analysis of Floating-Body-Induced Leakage Current in 0.15μm SOI DRAM", Proceedings 1996 IEEE International SOI Conference, Oct. 1996, pp. 138-139.
Thomas et al., "An SOI 4 Transistors Self-Refresh Ultra-Low-Voltage Memory Cell", IEEE, Mar. 2003, pp. 401-404.
Tomishima, et al., "A Long Data Retention SOI DRAM with the Body Refresh Function", IEICE Trans. Electron., vol. E80-C, No. 7, Jul. 1997, pp. 899-904.
Tsaur et al., "Fully Isolated Lateral Bipolar-MOS Transistors Fabricated in Zone-Melting-Recrystallized Si Films on SiO2", IEEE Electron Device Letters, vol. EDL-4, No. 8, Aug. 1983, pp. 269-271.
Tu, et al., "Simulation of Floating Body Effect in SOI Circuits Using BSIM3SOI", Proceedings of Technical Papers (IEEE Cat No. 97TH8303), Jun. 1997, pp. 339-342.
Villaret et al., "Mechanisms of Charge Modulation in the Floating Body of Triple-Well nMOSFET Capacitor-less DRAMs", Proceedings of the INFOS 2003, Insulating Films on Semiconductors, 13th Bi-annual Conference, Jun. 18-20, 2003, Barcelona (Spain), (4 pages).
Villaret et al., "Triple-Well nMOSFET Evaluated as a Capacitor-Less DRAM Cell for Nanoscale Low-Cost & High Density Applications", Handout at Proceedings of 2003 Silicon Nanoelectronics Workshop, Jun. 8-9, 2003, Kyoto, Japan (2 pages).
Villaret et al., Further Insight into the Physics and Modeling of Floating Body Capacitorless DRAMs, 2005, IEEE Trans. On El. Dev.
Wang et al., A Novel 4.5F2 Capacitorless Semiconductor Memory Device, 2008, IEEE EDL.
Wann et al., "A Capacitorless DRAM Cell on SOI Substrate", IEEE IEDM, 1993, pp. 635-638.
Wann et al., "High-Endurance Ultra-Thin Tunnel Oxide in MONOS Device Structure for Dynamic Memory Application", IEEE Electron Device Letters, vol. 16, No. 11, Nov. 1995, pp. 491-493.
Wei, A., "Measurement of Transient Effects in SOI DRAM/SRAM Access Transistors", IEEE Electron Device Letters, vol. 17, No. 5, May 1996, pp. 193-195.
Wouters, et al., "Characterization of Front and Back Si-SiO2 Interfaces in Thick- and Thin-Film Silicon-on-Insulator MOS Structures by the Charge-Pumping Technique", IEEE Transactions on Electron Devices, vol. 36, No. 9, Sep. 1989, pp. 1746-1750.
Wu, Dake, "Performance Improvement of the Capacitorless DRAM Cell with Quasi-SOI Structure Based on Bulk Substrate," Extended Abstracts of the 2009 ICSSDM, Sendai, 2009, pp. 146-147.
Yamanaka et al., "Advanced TFT SRAM Cell Technology Using a Phase-Shift Lithography", IEEE Transactions on Electron Devices, vol. 42, No. 7, Jul. 1995, pp. 1305-1313.
Yamauchi et al., "High-Performance Embedded SOI DRAM Architecture for the Low-Power Supply", IEEE Journal of Solid-State Circuits, vol. 35, No. 8, Aug. 2000, pp. 1169-1178.
Yamawaki, M., "Embedded DRAM Process Technology", Proceedings of the Symposium on Semiconductors and Integrated Circuits Technology, 1998, vol. 55, pp. 38-43.
Yang, Optimization of Nanoscale Thyristors on SOI for High-Performance High-Density Memories, 2006, SOI Conference.
Yoshida et al., "A Design of a Capacitorless 1-T-DRAM Cell Using Gate-induced Drain Leakage (GIDL) Current for Low-Power and High-speed Embedded Memory", 2003 IEEE, 4 pages.
Yoshida et al., "A Study of High Scalable DG-FinDRAM", IEEE Electron Device Letters, vol. 26, No. 9, Sep. 2005, pp. 655-657.
Yoshida et al., A Capacitorless 1T-DRAM Technology Using GIDL Current for Low Power and High Speed Embedded Memory, 2006, IEEE Trans. On El. Dev.
Yu et al., Hot-Carrier Effect in Ultra-Thin-Film (UTF) Fully-Depleted SOI MOSFET's, 54th Annual Device Research Conference Digest (Cat. No. 96TH8193), Jun. 1996, pp. 22-23.
Yu et al., "Hot-Carrier-Induced Degradation in Ultra-Thin-Film Fully-Depleted SOI MOSFETs", Solid-State Electronics, vol. 39, No. 12, 1996, pp. 1791-1794.
Yu et al., "Interface Characterization of Fully-Depleted SOI MOSFET by a Subthreshold I-V Method", Proceedings 1994 IEEE International SOI Conference, Oct. 1994, pp. 63-64.
Yun et al., Analysis of Sensing Margin in SOONO Device for the Capacitor-less RAM Applications, 2007, SOI Conference.
Zhou, Physical Insights on BJT-Based 1T DRAM Cells, IEEE Electron Device Letters, vol. 30, No. 5, May 2009.
Ban et al., Integration of Back-Gate Doping for 15-nm Node Floating Body Cell (FBC) Memory, Components Research, Process Technology Modeling, presented in the 2010 VLSI Symposium on Jun. 17, 2010.
Tanabe et al., A 30-ns 64-MB DRAM with Built-in-Self-Test and Self-Repair Function, IEEE Journal of Solid State Circuits, vol. 27, No. 11, pp. 1525-1533, Nov. 1992.
International Search Report for International Application No. PCT/US2010/26209, mailed Nov. 2, 2010.
Written Opinion for International Application No. PCT/US2010/26209, mailed Nov. 2, 2010.

* cited by examiner

400

600

700

700

TECHNIQUES FOR FORMING A CONTACT TO A BURIED DIFFUSION LAYER IN A SEMICONDUCTOR MEMORY DEVICE

CROSS-REFERENCE TO RELATED APPLICATIONS

This patent application claims priority to U.S. Provisional Patent Application No. 61/157,504, filed Mar. 4, 2009, which is hereby incorporated by reference herein in its entirety.

FIELD OF THE DISCLOSURE

The present disclosure relates generally to semiconductor memory devices and, more particularly, to techniques for forming a contact to a buried diffusion layer in a semiconductor memory device.

BACKGROUND OF THE DISCLOSURE

The semiconductor industry has experienced technological advances that have permitted increases in density and/or complexity of semiconductor memory devices. Also, the technological advances have allowed decreases in power consumption and package sizes of various types of semiconductor memory devices. There is a continuing trend to employ and/or fabricate advanced semiconductor memory devices using techniques, materials, and devices that improve performance, reduce leakage current, and enhance overall scaling. Semiconductor-on-insulator (SOI) and bulk substrates are examples of materials that may be used to fabricate such semiconductor memory devices. Such semiconductor memory devices may include, for example, partially depleted (PD) devices, fully depleted (FD) devices, multiple gate devices (for example, double or triple gate), and Fin-FET devices.

A semiconductor memory device may include a memory cell having a memory transistor with an electrically floating body region wherein electrical charges may be stored. The electrical charges stored in the electrically floating body region may represent a logic high (e.g., binary "1" data state) or a logic low (e.g., binary "0" data state). Also, a semiconductor memory device may be fabricated on semiconductor-on-insulator (SOI) substrates or bulk substrates (e.g., enabling body isolation). For example, a semiconductor memory device may be fabricated as a three-dimensional (3-D) device (e.g., multiple gate devices, Fin-FETs, recessed gates and pillars).

In one conventional technique, an array of minimum feature size memory cells may print uniformly in accordance with certain lithographic specifications while the periodicity of a lithographic pattern remains consistent. When the periodicity of the lithographic pattern is interrupted (e.g., at an edge of the array), however, the minimum feature size memory cells may not print uniformly.

In another conventional technique, a storage array of minimum feature size memory cells may use dummy pillar structures to ensure proper printing of active pillar structures near an array edge when the periodicity of a lithographic pattern is interrupted to form a bottom contact to buried diffusion. These dummy pillar structures may be similar to active pillar structures in physical appearance, but may not contribute to any storage function of the array. Likewise, if, for example, the bottom contact to buried diffusion is nested within an array of pillar structures, dummy pillar structures may be formed on both sides of the nested bottom contact to buried diffusion to provide for proper printing of adjacent active pillar structures.

Often, the conventional use of dummy pillar structures may significantly increase area overhead of the array since, for example, two (2) rows of dummy pillar structures may be formed between a row of bottom contacts to buried diffusion and an array of active pillar structures. In certain instances, the area overhead attributed to the use of dummy pillar structures may double when the bottom contacts to buried diffusion are nested within an array of pillar structures. In such instances, for example, two (2) rows of dummy pillar structures may be formed on both sides of the nested bottom contacts. Also, the conventional use of dummy pillar structures may significantly increase the processing cost and complexity of forming array edges that include separate pillar bottom contacts to buried diffusion.

In view of the foregoing, it may be understood that there may be significant problems and shortcomings associated with the conventional use of conventional dummy pillar structures.

SUMMARY OF THE DISCLOSURE

Techniques for forming a contact to a buried diffusion layer in a semiconductor memory device are disclosed. In one particular exemplary embodiment, the techniques may be realized as a semiconductor memory device. The semiconductor memory device may comprise a substrate comprising an upper layer. The semiconductor memory device may also comprise an array of dummy pillars formed on the upper layer of the substrate and arranged in rows and columns. Each of the dummy pillars may extend upward from the upper layer and have a bottom contact that is electrically connected with the upper layer of the substrate. The semiconductor memory device may also comprise an array of active pillars formed on the upper layer of the substrate and arranged in rows and columns. Each of the active pillars may extend upward from the upper layer and have an active first region, an active second region, and an active third region. Each of the active pillars may also be electrically connected with the upper layer of the substrate.

In accordance with other aspects of this particular exemplary embodiment, the rows of the dummy pillars may extend along a word line direction and the columns of the dummy pillars may extend along a bit line direction.

In accordance with further aspects of this particular exemplary embodiment, each of the dummy pillars may have a dummy first region, a dummy second region, and a dummy third region.

In accordance with additional aspects of this particular exemplary embodiment, the dummy first region may comprise a dummy upper region doped with a type of impurity, the dummy second region may comprise a dummy middle region doped with the type of impurity, and the dummy third region may comprise a dummy lower region doped with the type of impurity.

In accordance with other aspects of this particular exemplary embodiment, each dummy middle region may be capacitively coupled to at least one dummy word line.

In accordance with further aspects of this particular exemplary embodiment, the rows of the active pillars may extend along a word line direction and the columns of the active pillars may extend along a bit line direction.

In accordance with additional aspects of this particular exemplary embodiment, the active first region may comprise an active upper region doped with a first type of impurity, the active second region may comprise an active middle region doped with a second type of impurity, and the active third region may comprise an active lower region doped with the first type of impurity.

In accordance with other aspects of this particular exemplary embodiment, the active middle region of each active pillar may be electrically floating and disposed between the active upper region and the active lower region.

In accordance with further aspects of this particular exemplary embodiment, a gate region may be formed on at least one side of the active middle region of each active pillar.

In accordance with additional aspects of this particular exemplary embodiment, the active middle region of each active pillar may be capacitively coupled to an active word line.

In accordance with other aspects of this particular exemplary embodiment, the active upper region of each active pillar may be coupled to at least one active bit line.

In accordance with further aspects of this particular exemplary embodiment, the array of dummy pillars may extend along an outer edge of an array of memory cells formed on the substrate.

In accordance with additional aspects of this particular exemplary embodiment, the array of dummy pillars may be adjacent to the array of active pillars.

In another particular exemplary embodiment, the techniques may be realized as another semiconductor memory device. The semiconductor memory device may comprise a substrate comprising an upper layer. The semiconductor memory device may also comprise a column of dummy pillars formed on the upper layer of the substrate. Each of the dummy pillars may extend upward from the upper layer and have a bottom contact that is electrically connected with the upper layer of the substrate. The semiconductor memory device may also comprise a first array of active pillars formed on the upper layer of the substrate and arranged in rows and columns. The semiconductor memory device may also comprise a second array of active pillars formed on the upper layer of the substrate and arranged in rows and columns. Each of the active pillars may extend upward from the upper layer and have an active first region, an active second region, and an active third region. Each of the active pillars may also be electrically connected with the upper layer of the substrate.

In accordance with other aspects of this particular exemplary embodiment, the column of dummy pillars may extend along a bit line direction.

In accordance with further aspects of this particular exemplary embodiment, each of the dummy pillars may have a dummy first region, a dummy second region, and a dummy third region.

In accordance with additional aspects of this particular exemplary embodiment, the dummy first region may comprise a dummy upper region doped with a type of impurity, the dummy second region may comprise a dummy middle region doped with the type of impurity, and the dummy third region may comprise a dummy lower region doped with the type of impurity.

In accordance with other aspects of this particular exemplary embodiment, the rows of the active pillars may extend along a word line direction and the columns of the active pillars may extend along a bit line direction.

In accordance with further aspects of this particular exemplary embodiment, the active first region may comprise an active upper region doped with a first type of impurity, the active second region may comprise an active middle region doped with a second type of impurity, and the active third region may comprise an active lower region doped with the first type of impurity.

In accordance with additional aspects of this particular exemplary embodiment, the active middle region of each active pillar may be electrically floating and disposed between the active upper region and the active lower region.

In accordance with other aspects of this particular exemplary embodiment, a gate region may be formed on at least one side of the active middle region of each active pillar.

In accordance with further aspects of this particular exemplary embodiment, the active middle region of each active pillar may be capacitively coupled to an active word line.

In accordance with additional aspects of this particular exemplary embodiment, the active upper region of each active pillar may be coupled to at least one active bit line.

In accordance with other aspects of this particular exemplary embodiment, the column of dummy pillars may be nested between the first array of active pillars and the second array of active pillars.

The present disclosure will now be described in more detail with reference to exemplary embodiments thereof as shown in the accompanying drawings. While the present disclosure is described below with reference to exemplary embodiments, it should be understood that the present disclosure is not limited thereto. Those of ordinary skill in the art having access to the teachings herein will recognize additional implementations, modifications, and embodiments, as well as other fields of use, which are within the scope of the present disclosure as described herein, and with respect to which the present disclosure may be of significant utility.

BRIEF DESCRIPTION OF THE DRAWINGS

In order to facilitate a fuller understanding of the present disclosure, reference is now made to the accompanying drawings, in which like elements are referenced with like numerals. These drawings should not be construed as limiting the present disclosure, but are intended to be exemplary only.

DETAILED DESCRIPTION OF EXEMPLARY EMBODIMENTS

A conventional array of minimum feature size (F) pillar structures may include an active array area that is adjacent to a dummy array area to ensure proper printing of a lithographic pattern when bottom contacts to diffusion are formed. The active array area may include an array of active pillar structures. Each active pillar structure may form a memory cell in a memory device that is configured to store electrical charge. An active pillar structure may store the electrical charge within an electrically floating body region. For example, the active pillar structure may store an electric charge that represents a logic high (e.g., binary "1" data state) or an electric charge that represents a logic low (e.g., binary "0" data state). The dummy array area may include at least two (2) rows of dummy pillar structures that separate the array of active pillar structures from the array edge. On the array-edge-side of the dummy array area, separate pillar bottom contacts to diffusion may be formed.

By way of a non-limiting example, a minimum feature size (F) of 32 nanometers (nm) may be used for 32 nm lithography. Assuming each pillar in a conventional pillar array has a plug contact height of 1F, an upper region (e.g., drain region, source region) height of 1F, a body region height of 2F, and a lower region (e.g., source region, drain region) height of 1F, forming a separate 5F tall contact to the bottom diffusion may significantly increase processing costs and the complexity of the conventional pillar array at the array edge. Furthermore, the area overhead of the conventional pillar array may be significantly increased when the separate contacts to the bottom diffusion are nested within the pillar array. In such instances, the area overhead attributed to the formation of the separate contacts to the bottom diffusion may double since at least two (2) rows of dummy pillars may be formed on both sides of the nested contacts to the bottom diffusion.

Figure 1:
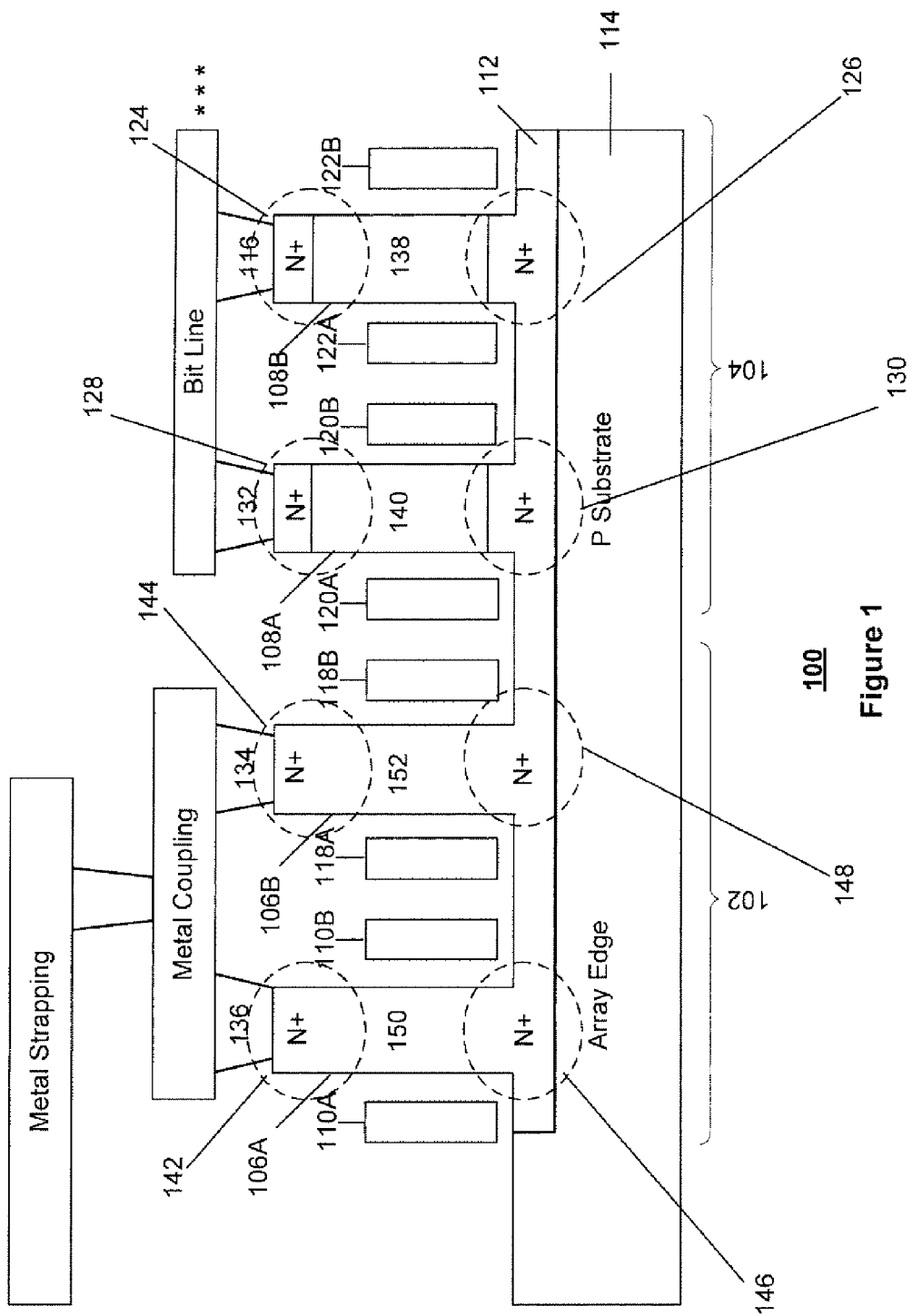
FIG. 1 shows a cross-sectional view of a pillar array of a semiconductor memory device with bottom contacts to diffusion formed on dummy pillars in accordance with an embodiment of the present disclosure.

Referring to FIG. 1, there is shown a cross-sectional view of a pillar array 100 of a semiconductor memory device with bottom contacts to diffusion formed on dummy pillars in accordance with an embodiment of the present disclosure. As illustrated in FIG. 1, the pillar array 100 may include any, or a combination, of a substrate 114, a diffusion layer 112, an active array area 104, one or more active pillars 108A, 108B, a dummy array area 102, and one or more dummy pillars 106A, 106B.

The substrate 114 and the diffusion layer 112 of the substrate 114 may each be formed from a semiconductor material that is doped with a P type impurity concentration, an N type impurity concentration, or any other type of impurity concentration. In one embodiment, the semiconductor material of substrate 114 and the semiconductor material of diffusion layer 112 may be doped with impurity concentrations that are of opposite types. For example, as shown in FIG. 1, the semiconductor material of substrate 114 may be doped with a P type impurity concentration and the semiconductor material of diffusion layer 112 may be doped with an N+ type impurity concentration.

The diffusion layer 112 may include an active array area 104 on which an array of one or more active pillars 108A, 108B are formed. Active pillars 108A, 108B may be vertical transistors that include upper regions 128, 124, middle regions 140, 138, and lower regions 130, 126, respectively.

Each of the upper regions 128, 124, middle regions 140, 138, and lower regions 130, 126 may be formed of a semiconductor material that is doped with a P type impurity concentration, an N type impurity concentration, or any other type of impurity concentration. In one embodiment, the semiconductor material of upper regions 128, 124 and the semiconductor material of lower regions 130, 126 may be doped with impurity concentrations that are the same type. In another embodiment, the semiconductor material of middle regions 140, 138 may be doped with an impurity concentration that is of the opposite type of the impurity concentration of the semiconductor material of the upper regions 128, 124 and the lower regions 130, 126. For example, as shown in FIG. 1, the semiconductor material of upper regions 128, 124 and the lower regions 130, 126 may be doped with an N+ type impurity concentration, and the semiconductor material of middle regions 140, 138 may be doped with a P+ type impurity concentration.

The upper regions 128, 124 may be source regions, drain regions, or any other type of region. The lower regions 130, 126 may be drain regions, source regions, or any other type of region. The middle regions 140, 138 may be body regions that are electrically floating.

The middle regions 140, 138 of active pillars 108A, 108B may be coupled (e.g., capacitively coupled) to a gate structure formed from a poly-silicon material, metal material, metal silicide material, and/or any other material that may be used to form a gate of an active pillar. A gate structure may be a single gate structure, a dual gate structure, a triple gate structure, a quadruple gate structure, etc. For example, the middle regions 140, 138 of active pillars 108A, 108B may be coupled to dual gate structures. Each gate of each active pillar may be coupled to gates of one or more additional active pillars positioned in a row to form a word line. In one example, one gate of active pillar 108A may be coupled to gates of one or more additional active pillars (not shown) positioned in a row to form word line 120A, and another gate of active pillar 108A may be coupled to other gates of the one or more additional active pillars to form word line 120B. In another example, one gate of active pillar 108B may be coupled to gates of one or more additional active pillars (not shown) positioned in a row to form word line 122A, and another gate of active pillar 108B may be coupled to other gates of the one or more additional active pillars to form word line 122B. Accordingly, the rows of the active pillars (including active pillars 108A, 108B) may extend in a word line direction that is parallel to diffusion layer 112.

Each upper region of each active pillar may be coupled to a plug contact (e.g., a poly-silicon plug contact) that is coupled to a bit line. For example, the upper region 128 of active pillar 108A may be coupled to plug contact 132 that is coupled to a bit line. Furthermore, the upper region 124 of active pillar 108E may be coupled to plug contact 116 that is coupled to the bit line. The columns of the active pillars may extend in a bit line direction that is parallel to diffusion layer 112.

Active pillars 108A, 108B may operate as memory cells that store electrical charge in middle regions 140, 138 (e.g., body regions) that are electrically floating. For example, the middle regions 140, 138 of active pillars 108A, 108B may store electrical charge that represents a logic high (e.g., binary "1" data state) or a logic low (e.g., binary "0" data state).

The diffusion layer 112 may include a dummy array area 102 on which an array of one or more dummy pillars 106A, 106B are formed. The dummy array area 102 may extend along an array edge of the pillar array 100. Dummy pillars 106A, 106B may be similar to active pillars 108A, 108B in physical appearance, but may not contribute to any storage function of the pillar array 100 except to provide contacts (e.g., electrical connections) to the diffusion layer 112.

Dummy pillars 106A, 106B may include upper regions 142, 144, middle regions 150, 152, and lower regions 146, 148, respectively. Each of the upper regions 142, 144, middle regions 150, 152, and lower regions 146, 148 may be formed of a semiconductor material that is doped with a P type impurity concentration, an N type impurity concentration, or any other type of impurity concentration. In one embodiment, the semiconductor material of upper regions 142, 144, middle regions 150, 152, and lower regions 146, 148 may be doped with impurity concentrations that are the same type. For example, as shown in FIG. 1, the semiconductor material of the upper regions 142, 144, middle regions 150, 152, and lower regions 146, 148 may be doped with an N+ type impurity concentration.

The middle regions 150, 152 of dummy pillars 106A, 106E may be coupled (e.g., capacitively coupled) to a dummy gate structure formed from a poly-silicon material, metal material, metal silicide material, and/or any other material that may be used to form a dummy gate of a dummy pillar. A dummy gate structure may be a single dummy gate structure, a dual dummy gate structure, a triple dummy gate structure, a quadruple dummy gate structure, etc. For example, the middle regions 150, 152 of dummy pillars 106A, 106B may be coupled to dual dummy gate structures. Each dummy gate of each dummy pillar may be coupled to dummy gates of one or more additional dummy pillars positioned in a row to form a dummy word line. In one example, one dummy gate of dummy pillar 106A may be coupled to dummy gates of one or more additional dummy pillars (not shown) positioned in a row to form dummy word line 110A, and another dummy gate of dummy pillar 106A may be coupled to other dummy gates of the one or more additional dummy pillars to form dummy word line 110B. In another example, one dummy gate of dummy pillar 106B may be coupled to dummy gates of one or more additional dummy pillars (not shown) positioned in a row to form dummy word line 118A, and another dummy gate of dummy pillar 106E may be coupled to other dummy gates of the one or more additional dummy pillars to form dummy word line 118B. Accordingly, the rows of the dummy pillars (including dummy pillars 106A, 106B) may extend in a word line direction that is parallel to diffusion layer 112.

Each upper region of each dummy pillar may be coupled to a plug contact (e.g., a poly-silicon plug contact) that is coupled to metal coupling that, in turn, is coupled to a metal strapping. Thus, each dummy pillar provides an electrical connection between a metal strapping and the diffusion layer 112. For example, the upper region 142 of dummy pillar 106A may be coupled to plug contact 136 that is coupled to a metal coupling that, in turn, is coupled to a metal strapping. Thus, dummy pillar 106A provides an electrical connection between the metal strapping and the diffusion layer 112. Furthermore, the upper region 144 of dummy pillar 106B may be coupled to plug contact 134 that is coupled a metal coupling that, in turn, is coupled to a metal strapping. Thus, dummy pillar 106B provides an electrical connection between the metal strapping and the diffusion layer 112. The columns of the dummy pillars may extend in a bit line direction that is parallel to diffusion layer 112.

Accordingly, dummy pillars 106A, 106B may be used as bottom contacts to the diffusion layer 112 to reduce the area overhead of the pillar array 100 attributed to the formation of separate contacts to the diffusion layer 112. Details of exemplary processing steps for forming contacts to a bottom diffusion layer on dummy pillars are provided below with reference to FIGS. 6-7B.

Figure 2:
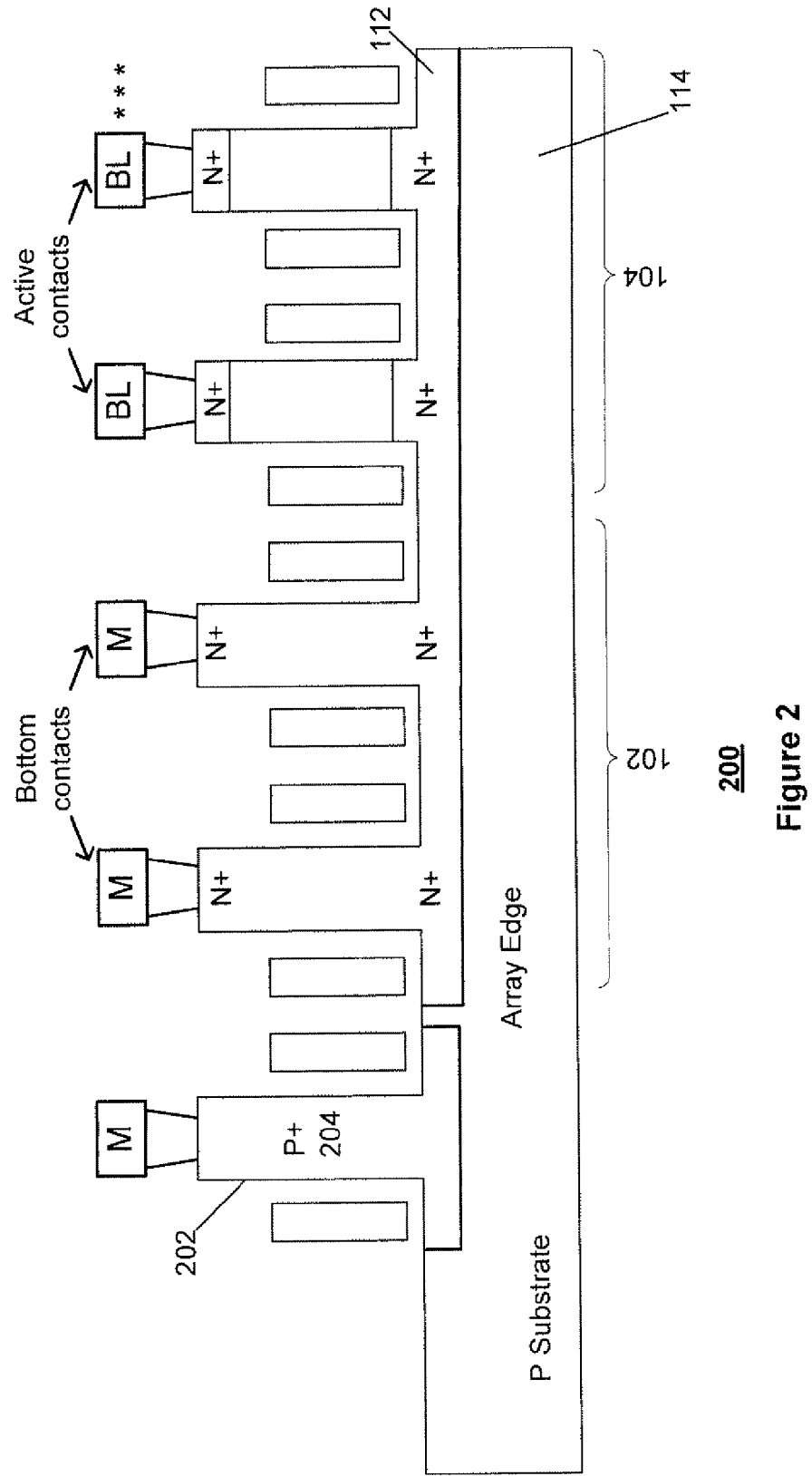
FIG. 2 shows a cross-sectional view of a pillar array of a semiconductor memory device with bottom contacts to diffusion formed on dummy pillars and a pillar substrate contact in accordance with an embodiment of the present disclosure.

Referring to FIG. 2, there is shown a cross-sectional view of a pillar array 200 of a semiconductor memory device with bottom contacts to diffusion formed on dummy pillars and a pillar substrate contact in accordance with an embodiment of the present disclosure. As illustrated in FIG. 2, the pillar array 200 may include any, or a combination, of a substrate 114, a diffusion layer 112, an active array area 104 with one or more active pillars, a dummy array area 102 with one or more dummy pillars, and a pillar substrate contact 202. Pillar array 200 may be similar to pillar array 100 described above with reference to FIG. 1.

Pillar substrate contact 202 may be formed on substrate 114 and of a semiconductor material and/or a metal material. For example, the pillar body 204 of pillar substrate contact 202 may be formed from a semiconductor material that is doped with a P type impurity concentration, N type impurity concentration, or any other type of impurity concentration. In one embodiment, the semiconductor material of the pillar body 204 and the semiconductor material of the active pillars, dummy pillars, and diffusion layer 112, may be doped with impurity concentrations that are of the opposite type. In another embodiment, the semiconductor material of the pillar body 204 and the semiconductor material of substrate 114 may be doped with impurity concentrations that are of the same type. For example, the semiconductor material of pillar body 204 may be doped with a P+ type impurity concentration. The contact material of pillar substrate contact 202 may be formed from a metal material (e.g., tungsten), metal-silicide material, metal-like material, or any other material that may be used to provide an electrical connection between the pillar substrate contact 202 and the substrate 114.

The pillar substrate contact 202 may be positioned adjacent to one or more dummy pillars of the dummy array area 102. As previously described with reference to FIG. 1, the one or more dummy pillars may provide bottom contacts to diffusion layer 112 at the array edge of pillar array 200. Further, one or more active pillars of the active array area 104 may be positioned adjacent to the dummy array area 102. The one or more active pillars may operate as memory cells of the pillar array 200.

Figure 3:
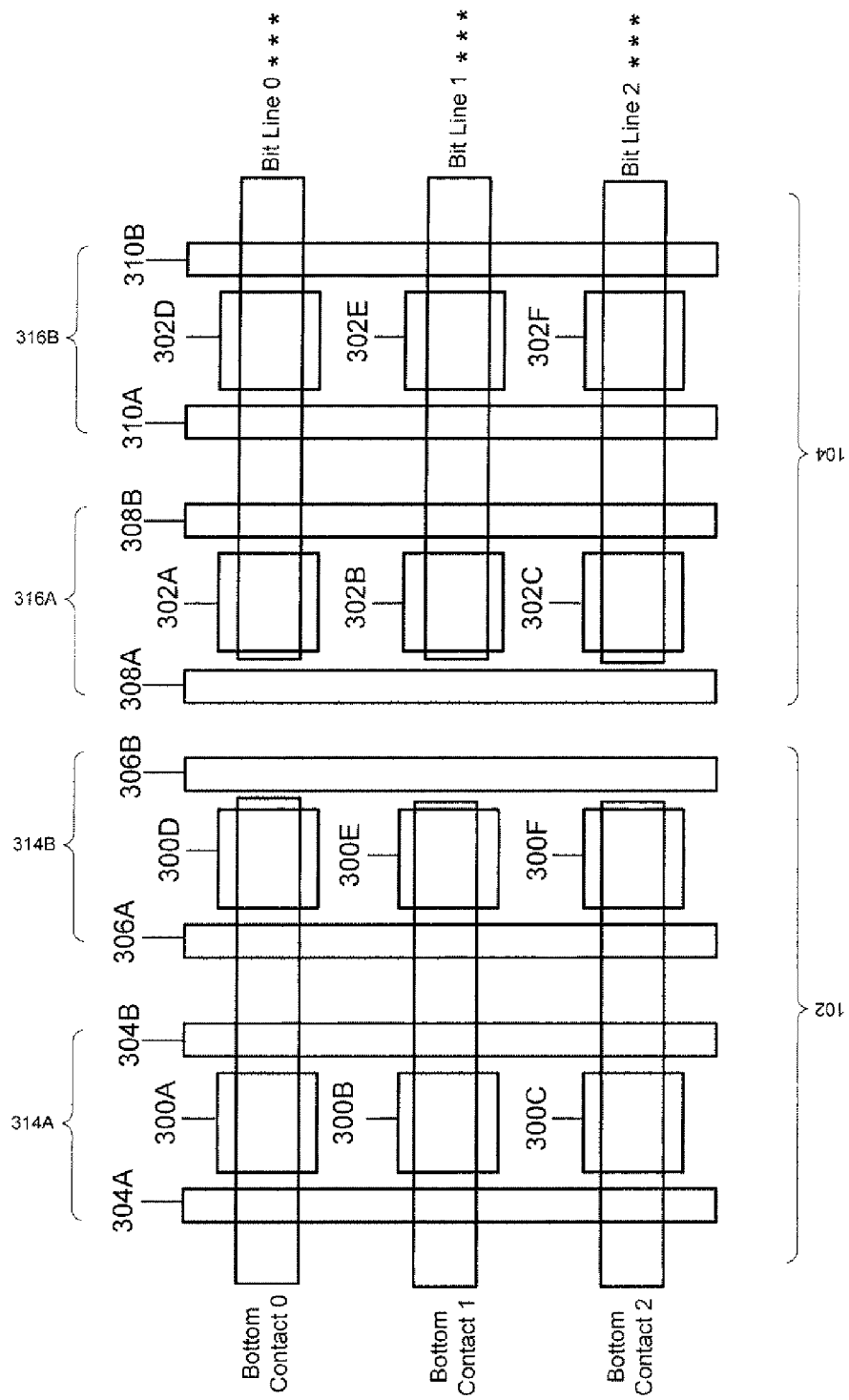
FIG. 3 shows a two-dimensional top view of a pillar array of a semiconductor memory device with bottom contacts to diffusion formed on dummy pillars in accordance with an embodiment of the present disclosure.

Referring to FIG. 3, there is shown a two-dimensional top view of a pillar array 312 of a semiconductor memory device with bottom contacts to diffusion formed on dummy pillars in accordance with an embodiment of the present disclosure. As illustrated in FIG. 3, the pillar array 312 may include any, or a combination, of an active array area 104, one or more active pillars 302A, 302B, 302C, 302D, 302E, 302F, a dummy array area 102, and one or more dummy pillars 300A, 300B, 300C, 300D, 300E, 300F. Pillar array 312 may be two-dimensional top view of pillar array 100 described above with reference to FIG. 1.

As previously described with reference to FIG. 1, active array area 104 may include active pillars 302A, 302B, 302C, 302D, 302E, 302F. One gate of active pillars 302A, 302B, 302C may be coupled together in row 316A to form word line 308A. Another gate of active pillars 302A, 302B, 302C may be coupled together in row 316A to form word line 308B. Likewise, one gate of active pillars 302D, 302E, 302F may be coupled together in row 316B to form word line 310A. Another gate of active pillars 302D, 302E, 302F may be coupled together in row 316B to form word line 310B. Accordingly, the rows 316A, 316B of active pillars may extend in a word line direction.

In one embodiment, the upper regions of active pillars 302A, 302D may be coupled to Bit Line 0 to form a column of active pillars. In another embodiment, the upper regions of active pillars 302B, 302E may be coupled to Bit Line 1 to form another column of active pillars. In yet another embodiment, the upper regions of active pillars 302C, 302F may be coupled to Bit Line 2 to form another column of active pillars. Accordingly, the columns of active pillars may extend in a bit line direction.

As previously described with reference to FIG. 1, dummy array area 102 may include dummy pillars 300A, 300B, 300C, 300D, 300E, 300F. One dummy gate of dummy pillars 300A, 300E, 300C may be coupled together in row 314A to form dummy word line 304A. Another dummy gate of dummy pillars 300A, 300B, 300C may be coupled together in row 314A to form dummy word line 304B. Likewise, one dummy gate of dummy pillars 300D, 300E, 300F may be coupled together in row 314E to form dummy word line 306A. Another dummy gate of dummy pillars 300D, 300E, 300F may be coupled together in row 314B to form dummy word line 306B. Accordingly, the rows 314A, 314B of dummy pillars may extend in a dummy word line direction that is parallel to a word line direction.

In one embodiment, the upper regions of dummy pillars 300A, 300D may be coupled to Bottom Contact 0 to form a column of dummy pillars. In another embodiment, the upper regions of dummy pillars 300B, 300E may be coupled to Bottom Contact 1 to form another column of dummy pillars. In yet another embodiment, the upper regions of dummy pillars 300C, 300F may be coupled to Bottom Contact 2 to form another column of dummy pillars. Accordingly, the columns of dummy pillars may extend in a bit line direction.

As illustrated in FIGS. 1 and 3, area overhead at the array edge of pillar array 100 and pillar array 312 may be significantly reduced by eliminating the formation of separate standard (e.g., tungsten) bottom contacts to a diffusion layer. Instead, dummy pillars (e.g., dummy pillars 300A, 300B, 300C, 300D, 300E, 300F) may be used as bottom contacts to a diffusion layer.

Figure 4:
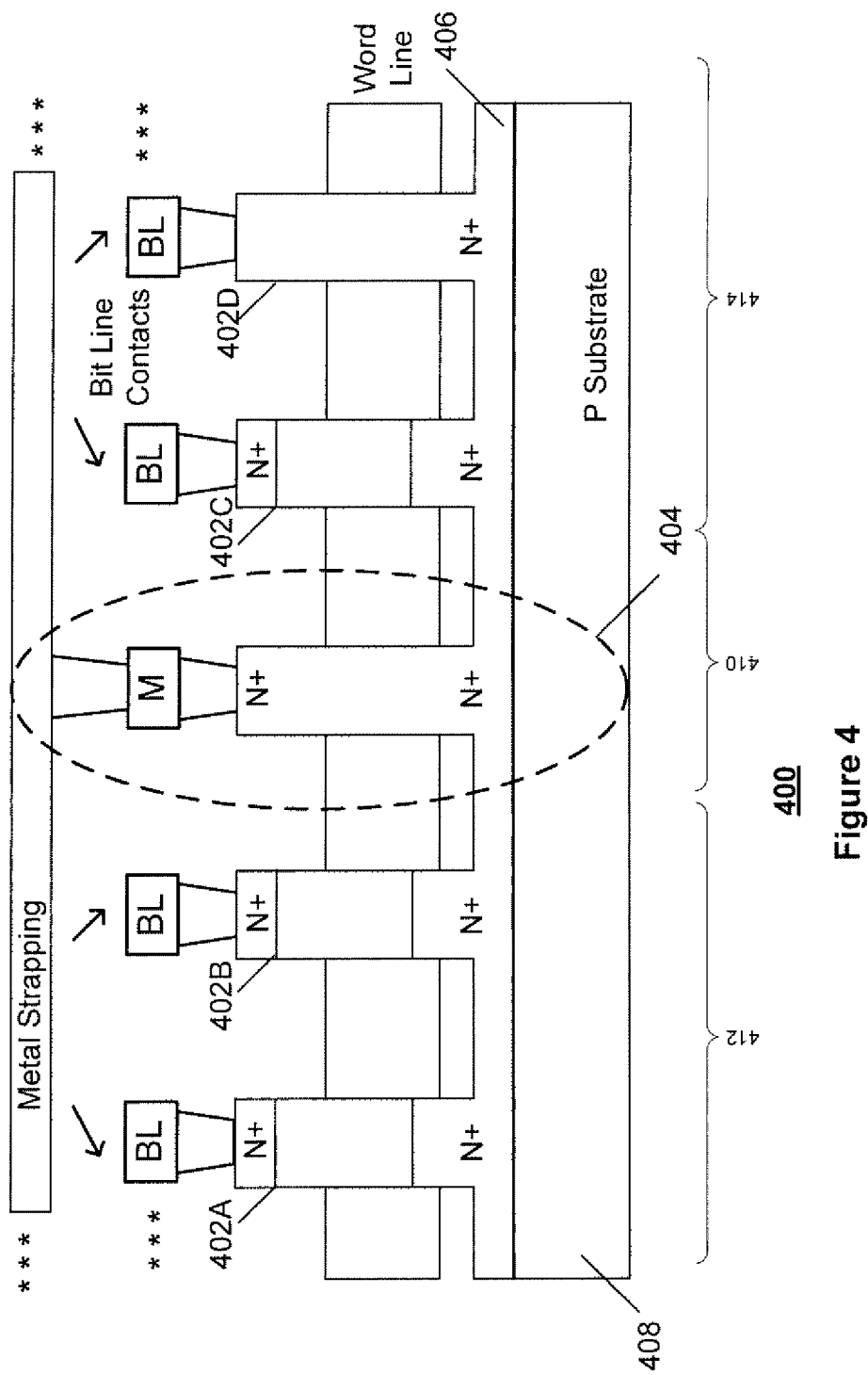
FIG. 4 shows a cross-sectional view of a pillar array of a semiconductor memory device with nested bottom contacts to diffusion formed on dummy pillars in accordance with an embodiment of the present disclosure.

Referring to FIG. 4, there is shown a cross-sectional view of a pillar array of a semiconductor memory device with nested bottom contacts to diffusion formed on dummy pillars in accordance with an embodiment of the present disclosure. As illustrated in FIG. 4, a pillar array 400 may include any, or a combination, of a substrate 408, a diffusion layer 406, an active array area 412, an active array area 414, one or more active pillars 402A, 402B, 402C, 402D, a dummy array area 410, and one or more dummy pillars 404. It should be noted that substrate 408 may be similar to substrate 114 of FIG. 1, diffusion layer 406 may be similar to diffusion layer 112 of FIG. 1, active pillars 402A, 402B, 402C, 402D may be similar to active pillars 108A, 108B of FIG. 1, and dummy pillar 404 may be similar to dummy pillars 106A, 106B of FIG. 1.

Active array area 412 may include active pillars 402A, 402B. Each upper region of each active pillar may be coupled to a plug contact (e.g., a poly-silicon plug contact) that is coupled to a bit line. The upper region of active pillar 402A may be coupled to a bit line that is coupled to one or more additional active pillars (not shown) positioned in a column. Likewise, the upper region of active pillar 402B may be coupled to a bit line that is coupled to one or more additional active pillars (not shown) positioned in another column. Accordingly, the columns of pillar array 400 containing active pillars 402A, 402E may extend in a bit line direction that is perpendicular to diffusion layer 406.

Active array area 414 may include active pillars 402C, 402D. Each upper region of each active pillar may be coupled to a plug contact (e.g., a poly-silicon plug contact) that is coupled to a bit line. The upper region of active pillar 402C may be coupled to a bit line that is coupled to one or more additional active pillars (not shown) positioned in a column. Likewise, the upper region of active pillar 402D may be coupled to a bit line that is coupled to one or more additional active pillars (not shown) positioned in another column. Accordingly, the columns of pillar array 400 containing active pillars 402C, 402D may extend in a bit line direction that is perpendicular to diffusion layer 406.

Dummy array area 410 may include dummy pillar 404 and one or more additional dummy pillars (not shown) positioned in a column. Each upper region of each dummy pillar may be coupled to a plug contact (e.g., a poly-silicon plug contact) that is coupled to metal strapping. Thus, each dummy pillar provides an electrical connection between a metal strapping and a diffusion layer. The upper region of dummy pillar 404 may be coupled to a plug contact that is coupled to a metal strapping. Thus, the dummy pillar 404 provides an electrical connection between the metal strapping and the diffusion layer 406. The column of the dummy pillars may extend in a bit line direction that is perpendicular to diffusion layer 406.

One gate (or dummy gate) of active pillars 402A, 402B, 402C, 402D, and dummy pillar 404 may be coupled together in a row to form a word line. Accordingly, the rows of the pillar array 400 may extend in a word line direction that is parallel to diffusion layer 406.

The dummy array area 410 may be nested between active array area 412 and active array area 414. Since the periodicity of a lithographic pattern is not broken to form separate nested bottom contacts to a buried diffusion layer, multiple columns of dummy pillars may be eliminated. Accordingly, the area overhead of pillar array 400 may be significantly reduced by forming bottom contacts to the diffusion layer on and/or within a nested column of dummy pillars that includes dummy pillar 404.

Figure 5:
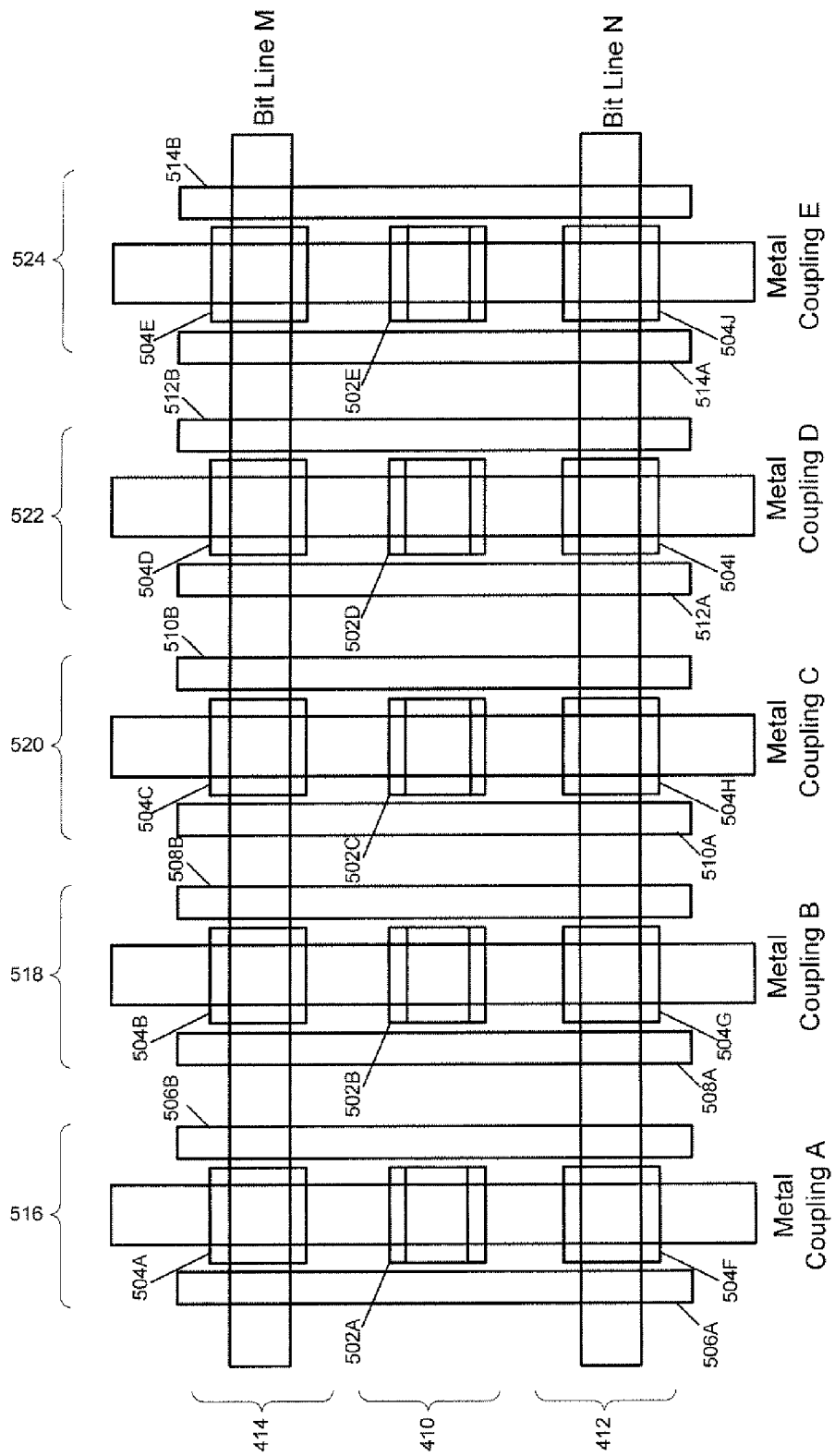
FIG. 5 shows a two-dimensional top view of a pillar array of a semiconductor memory device with nested bottom contacts to diffusion formed on dummy pillars in accordance with an embodiment of the present disclosure.

Referring to FIG. 5, there is shown a two-dimensional top view of a pillar array of a semiconductor memory device with nested bottom contacts to diffusion formed on dummy pillars in accordance with an embodiment of the present disclosure. As illustrated in FIG. 5, a pillar array 500 may include any, or a combination, of an active array area 414, an active array area 412, one or more active pillars 504A, 504B, 504C, 504D, 504E, 504F, 504G, 504H, 504I, 504J, a dummy array area 410, and one or more dummy pillars 502A, 502B, 502C, 502D, 502E. Pillar array 500 may be two-dimensional top view of a portion of pillar array 400 described above with reference to FIG. 4.

As previously described with reference to FIG. 4, active array area 414 may include active pillars 504A, 504B, 504C, 504D, 504E. Active array area 412 may include active pillars 504F, 504G, 504H, 504I, 504J. Dummy array area 410 may include dummy pillars 502A, 502B, 502C, 502D, 502E. One gate (or dummy gate) of active pillar 504A, dummy pillar 502A, and active pillar 504F may be coupled together in row 516 to form word line 306A. Another gate (or another dummy gate) of active pillar 504A, dummy pillar 502A, and active pillar 504F may be coupled together in row 516 to form word line 306B. One gate (or dummy gate) of active pillar 504B, dummy pillar 502B, and active pillar 504G may be coupled together in row 518 to form word line 308A. Another gate (or another dummy gate) of active pillar 504B, dummy pillar 502B, and active pillar 504G may be coupled together in row 518 to form word line 308B. One gate (or dummy gate) of active pillar 504C, dummy pillar 502C, and active pillar 504H may be coupled together in row 520 to form word line 310A. Another gate (or another dummy gate) of active pillar 504C, dummy pillar 502C, and active pillar 504H may be coupled together in row 520 to form word line 310B. One gate (or dummy gate) of active pillar 504D, dummy pillar 502D, and active pillar 504I may be coupled together in row 522 to form word line 312A. Another gate (or another dummy gate) of active pillar 504D, dummy pillar 502D, and active pillar 504I may be coupled together in row 522 to form word line 312B. Finally, one gate (or dummy gate) of active pillar 504E, dummy pillar 502E, and active pillar 504J may be coupled together in row 524 to form word line 314A. Another gate (or another dummy gate) of active pillar 504E, dummy pillar 502E, and active pillar 504J may be coupled together in row 524 to form word line 314B. Accordingly, the rows 516, 518, 520, 522, 524 of pillar array 500 may extend in a word line direction.

In one embodiment, the upper regions of active pillars 504A, 504B, 504C, 504D, 504E may be coupled to Bit Line M to form a column of active pillars. In another embodiment, the upper regions of active pillars 504F, 504G, 504H, 504I, 504J may be coupled to Bit Line N to form another column of active pillars. In yet another embodiment, the dummy pillars 502A, 502B, 502C, 502D, 502E may be positioned in a nested column (between the columns of active pillars). Accordingly, the columns of pillar array 500 may extend in a bit line direction.

The upper region of each dummy pillar may be coupled to a metal coupling. For example, the upper region of dummy pillar 502A may be coupled to Metal Coupling A that extends in a word line direction. In another example, the upper region of dummy pillar 502B may be coupled to Metal Coupling B that extends in a word line direction. In another example, the upper region of dummy pillar 502C may be coupled to Metal Coupling C that extends in a word line direction. In another example, the upper region of dummy pillar 502D may be coupled to Metal Coupling D that extends in a word line direction. In yet another example, the upper region of dummy pillar 502E may be coupled to Metal Coupling E that extends in a word line direction. Accordingly, Metal Couplings A, B, C, D, E may extend in a direction that is parallel to a word line direction and perpendicular to a bit line direction. It should be noted that Metal Couplings A, B, C, D, E may not be coupled to any active pillars.

As illustrated in FIGS. 4 and 5, the periodicity of a lithographic pattern may not be broken to form separate nested bottom contacts to a buried diffusion layer. Accordingly, multiple columns of dummy pillars may be eliminated and the area overhead of pillar array 400 and pillar array 500 may be significantly reduced by forming bottom contacts to the diffusion layer on and/or within a nested column of dummy pillars 502A, 502B, 502C, 502D, 502E.

Figure 6:
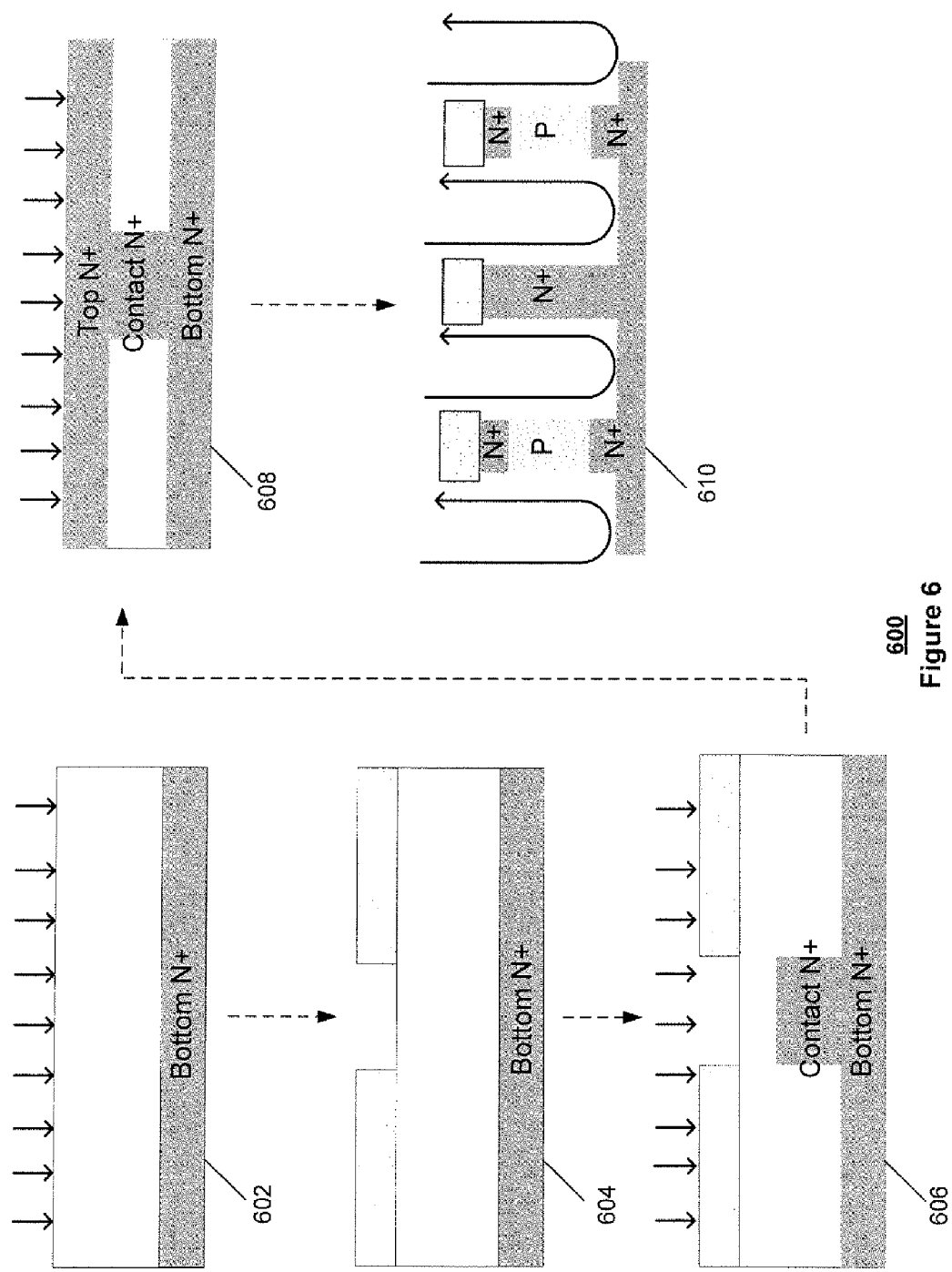
FIG. 6 shows processing steps for forming nested bottom contacts to diffusion on dummy pillars in accordance with an embodiment of the present disclosure.

Referring to FIG. 6, there is shown processing steps for forming nested bottom contacts to diffusion on dummy pillars in accordance with an embodiment of the present disclosure. As illustrated in FIG. 6, the process may include any, or a combination, of steps 602, 604, 606, 608, 610. Step 602 may include implanting (e.g., ion implanting) a diffusion layer (e.g., diffusion layer 112, diffusion layer 406) on a substrate. Step 604 may include covering the active array areas with a hard mask to ensure that the active array areas are not exposed. Step 606 may include exposing the dummy array area to open the dummy array area for a contact body implant (e.g., a bottom contact) and a body ion implant. Step 608 may include removing the hard masks and implanting (e.g., ion implanting) a top diffusion. Step 610 may include masking and etching the active pillars and a nested bottom contact dummy pillar.

Figure 7A:
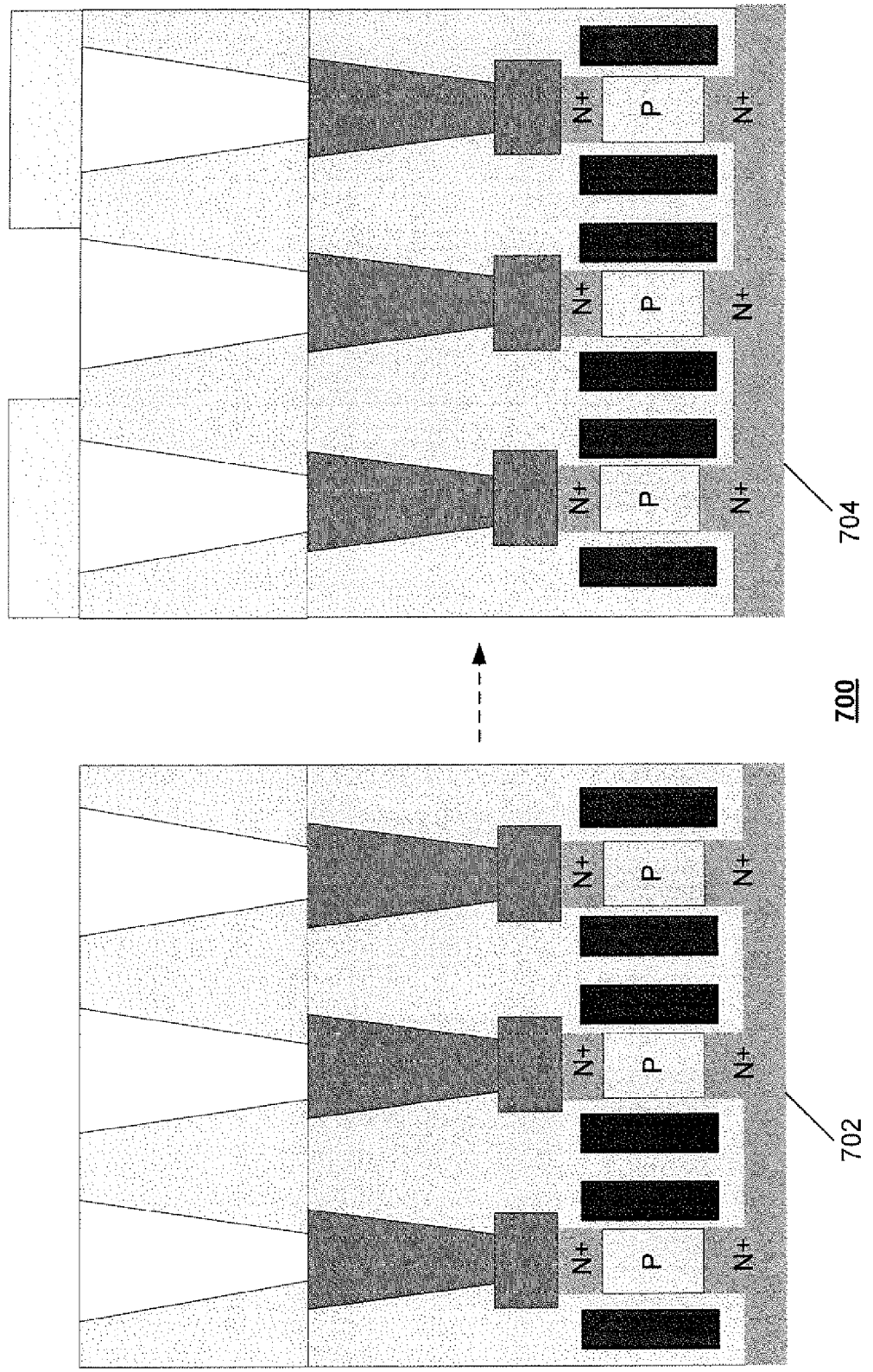
FIG. 7A shows processing steps for forming nested bottom contacts to diffusion on dummy pillars in accordance with an alternative embodiment of the present disclosure.

Referring to FIG. 7A, there is shown processing steps for forming nested bottom contacts to diffusion on dummy pillars in accordance with an alternative embodiment of the present disclosure. As illustrated in FIG. 7A, the process may include any, or a combination, of steps 702, 704. Step 702 may include having pillars with contacts (e.g., poly-silicon). Step 704 may include covering the active array areas with a hard mask to ensure that the active array areas are not etched.

Figure 7B:
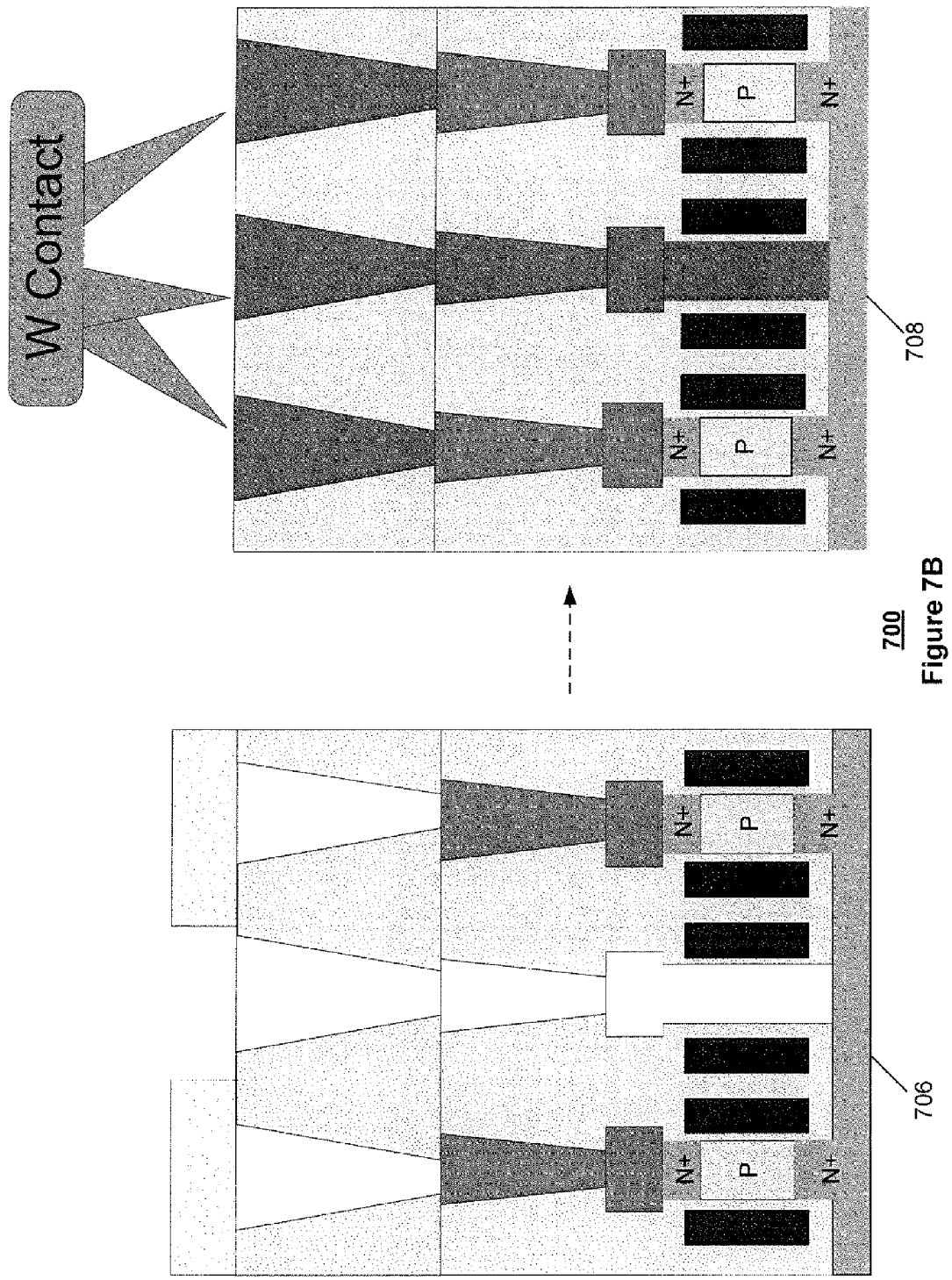
FIG. 7B shows additional processing steps for forming nested bottom contacts to diffusion on dummy pillars in accordance with an alternative embodiment of the present disclosure.

Referring to FIG. 7B, there is shown additional processing steps for forming nested bottom contacts to diffusion on dummy pillars in accordance with an alternative embodiment of the present disclosure. As illustrated in FIG. 7B, the process may include any, or a combination, of steps 706, 708. Step 706 may include etching the poly-silicon from an active pillar. Step 708 may include removing the hard mask and filling in the contacts with a poly-silicon material, metal material (e.g., tungsten), metal silicide material, or any other material that may be used as a contact. After step 708, the nested bottom contact dummy pillar may provide an electrical connection to the diffusion layer.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

The invention claimed is:

1. A semiconductor memory device comprising:
a substrate comprising a diffusion layer;
an array of dummy pillars formed on the diffusion layer and arranged in rows and columns, each of the dummy pillars extending upward from the diffusion layer and having a dummy upper region, a dummy middle region, and a dummy lower region, wherein each of the dummy upper region, the dummy middle region, and the dummy lower region are formed with a semiconductor material that is doped with a common first dopant type such that the dummy upper region is electrically connected with the diffusion layer through the dummy middle region and the dummy lower region via the semiconductor material that is doped with the common first dopant type, wherein the dummy upper region is further electrically connected to a metal strapping of the semiconductor memory device via a plug contact and a metal coupling, wherein the metal strapping extends parallel to a bit line that is parallel to the diffusion layer; wherein the columns of dummy pillars extend in a direction parallel to the bit line;
a pillar substrate contact formed on the substrate, wherein the pillar substrate contact is doped with a second dopant type that is opposite to the first dopant type; and
an array of active pillars formed on the diffusion layer and arranged in rows and columns, each of the active pillars extending upward from the diffusion layer and having an active first region, an active second region, and an active third region, and each of the active pillars being electrically connected with the diffusion layer;
wherein the array of dummy pillars provide all electrical connections between the metal strapping and the diffusion layer within and around the array of active pillars.

2. The semiconductor memory device of claim 1, wherein the rows of the dummy pillars extend along a word line direction.

3. The semiconductor memory device of claim 1, wherein each dummy middle region is capacitively coupled to at least one dummy word line.

4. The semiconductor memory device of claim 1, wherein the rows of the active pillars extend along a word line direction and the columns of the active pillars extend along a bit line direction.

5. The semiconductor memory device of claim 1, wherein the active first region comprises an active upper region doped with a first type of impurity, the active second region comprises an active middle region doped with a second type of impurity, and the active third region comprises an active lower region doped with the first type of impurity.

6. The semiconductor memory device of claim 5, wherein the active middle region of each active pillar is electrically floating and disposed between the active upper region and the active lower region.

7. The semiconductor memory device of claim 5, further comprising a gate region formed on at least one side of the active middle region of each active pillar.

8. The semiconductor memory device of claim 5, wherein the active middle region of each active pillar is capacitively coupled to an active word line.

9. The semiconductor memory device of claim 5, wherein the active upper region of each active pillar is coupled to at least one active bit line.

10. The semiconductor memory device of claim 1, wherein the array of dummy pillars extends along an outer edge of an array of memory cells formed on the substrate.

11. The semiconductor memory device of claim 1, wherein the array of dummy pillars is adjacent to the array of active pillars.

12. A semiconductor memory device comprising:
a substrate comprising a diffusion layer;
a column of dummy pillars formed on the diffusion layer, each of the dummy pillars extending upward from the diffusion layer and having a dummy upper region, a dummy middle region, and a dummy lower region, wherein each of the dummy upper region, the dummy middle region, and the dummy lower region are formed with a semiconductor material that is doped with a common first dopant type such that the dummy upper region is electrically connected with the diffusion layer through the dummy middle region and the dummy lower region via the semiconductor material that is doped with the common first dopant type, wherein the dummy upper region is further electrically connected to a metal strapping of the semiconductor memory device via a plug contact and a metal coupling, wherein the metal strapping extends parallel to a bit line that is parallel to the diffusion layer; wherein the column of dummy pillars extends in a direction parallel to the bit line;
a pillar substrate contact formed on the substrate, wherein the pillar substrate contact is doped with a second dopant type that is opposite to the first dopant type;
a first array of active pillars formed on the diffusion layer and arranged in rows and columns; and
a second array of active pillars formed on the diffusion layer and arranged in rows and columns;
wherein each of the active pillars extend upward from the diffusion layer and have an active first region, an active second region, and an active third region, and each of the active pillars are electrically connected with the diffusion layer;
wherein the column of dummy pillars provide all electrical connections between the metal strapping and the diffusion layer between the first array of active pillars and the second array of active pillars.

13. The semiconductor memory device of claim 12, wherein the rows of the active pillars extend along a word line direction and the columns of the active pillars extend along a bit line direction.

14. The semiconductor memory device of claim 12, wherein the active first region comprises an active upper region doped with a first type of impurity, the active second region comprises an active middle region doped with a second type of impurity, and the active third region comprises an active lower region doped with the first type of impurity.

15. The semiconductor memory device of claim 14, wherein the active middle region of each active pillar is electrically floating and disposed between the active upper region and the active lower region.

16. The semiconductor memory device of claim 14, further comprising a gate region formed on at least one side of the active middle region of each active pillar.

17. The semiconductor memory device of claim 14, wherein the active middle region of each active pillar is capacitively coupled to an active word line.

18. The semiconductor memory device of claim 14, wherein the active upper region of each active pillar is coupled to at least one active bit line.

19. The semiconductor memory device of claim 12, wherein the column of dummy pillars is nested between the first array of active pillars and the second array of active pillars.

20. The semiconductor memory device of claim 1, wherein each dummy middle region is capacitively coupled to a plurality of dummy word lines.

21. The semiconductor memory device of claim 5, wherein the active middle region of each active pillar is capacitively coupled to a plurality of active word lines.

22. The semiconductor memory device of claim 12, wherein each dummy middle region is capacitively coupled to a plurality of dummy word lines.

23. The semiconductor memory device of claim 14, wherein the active middle region of each active pillar is capacitively coupled to a plurality of active word lines.

* * * * *